United States Patent
Wright et al.

(10) Patent No.: US 9,500,948 B2
(45) Date of Patent: Nov. 22, 2016

(54) FLUORINATED PHOTORESIST WITH INTEGRATED SENSITIZER

(71) Applicant: Orthogonal, Inc., Rochester, NY (US)

(72) Inventors: Charles Warren Wright, Fairport, NY (US); Douglas Robert Robello, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 14/291,692

(22) Filed: May 30, 2014

(65) Prior Publication Data

US 2014/0356788 A1 Dec. 4, 2014

Related U.S. Application Data

(60) Provisional application No. 61/829,523, filed on May 31, 2013, provisional application No. 61/829,536, filed on May 31, 2013.

(51) Int. Cl.
*G03F 7/32* (2006.01)
*G03F 7/039* (2006.01)
*G03F 7/004* (2006.01)
*G03F 7/42* (2006.01)

(52) U.S. Cl.
CPC ........... *G03F 7/0045* (2013.01); *G03F 7/0046* (2013.01); *G03F 7/0392* (2013.01); *G03F 7/325* (2013.01); *G03F 7/426* (2013.01)

(58) Field of Classification Search
CPC ........ G03F 7/004; G03F 7/0046; G03F 7/32; G03F 7/325
See application file for complete search history.

(56) References Cited

U.S. PATENT DOCUMENTS

| | | | |
|---|---|---|---|
| 5,250,395 A | 10/1993 | Allen et al. | |
| 5,395,733 A * | 3/1995 | Maemoto et al. | 430/270.1 |
| 5,650,456 A | 7/1997 | Yun et al. | |
| 6,136,498 A | 10/2000 | Jagannathan et al. | |
| 7,632,630 B2 | 12/2009 | Mori et al. | |
| 8,338,529 B2 | 12/2012 | Hoshino et al. | |
| 2002/0055059 A1* | 5/2002 | Nishimura et al. | 430/270.1 |
| 2003/0219675 A1* | 11/2003 | Montgomery et al. | 430/270.1 |
| 2005/0181299 A1* | 8/2005 | Trefonas et al. | 430/270.1 |
| 2011/0159252 A1 | 6/2011 | Ober et al. | |
| 2014/0356789 A1* | 12/2014 | Wright et al. | 430/285.1 |

FOREIGN PATENT DOCUMENTS

WO  WO 2012/148884  11/2012

* cited by examiner

*Primary Examiner* — Anca Eoff
(74) *Attorney, Agent, or Firm* — Merchant & Gould P.C.

(57) ABSTRACT

A method of patterning a device comprises providing on a device substrate a layer of a fluorinated photopolymer comprising at least three distinct repeating units including a first repeating unit having a fluorine-containing group, a second repeating unit having an acid- or alcohol-forming precursor group, and a third repeating unit having a sensitizing dye. The photopolymer has a total fluorine content in a range of 15 to 60% by weight. The photopolymer layer is exposed to patterned light and contacted with a developing agent to remove a portion of exposed photopolymer layer in accordance with the patterned light, thereby forming a developed structure having a first pattern of photopolymer covering the substrate and a complementary second pattern of uncovered substrate corresponding to the removed portion of photopolymer. The developing agent comprises at least 50% by volume of a fluorinated solvent.

14 Claims, 6 Drawing Sheets

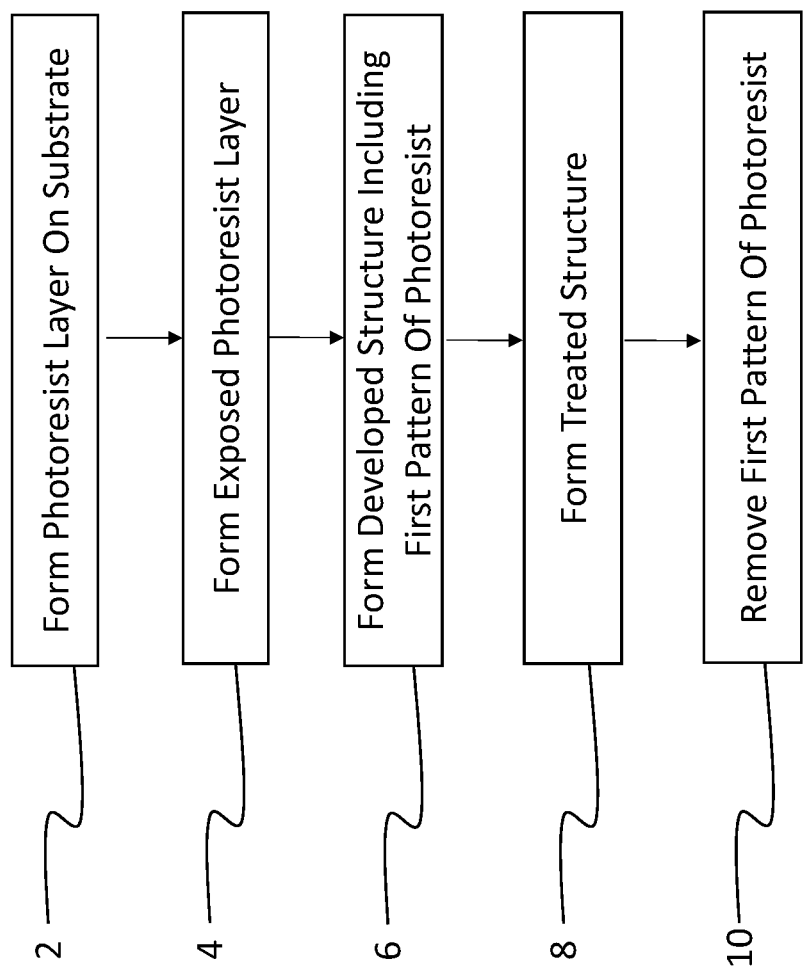

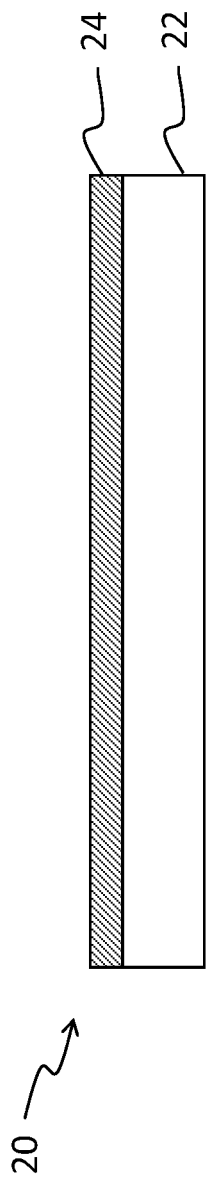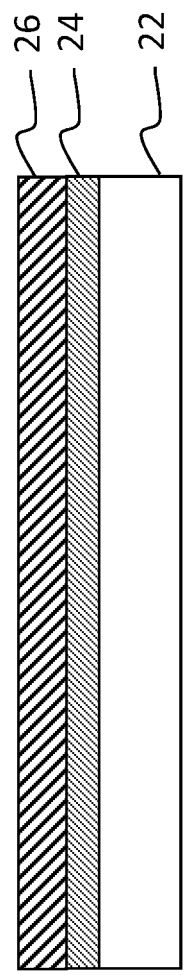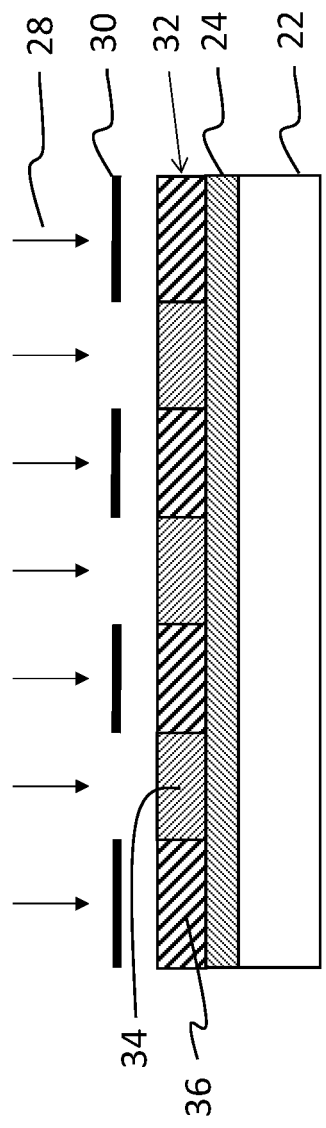

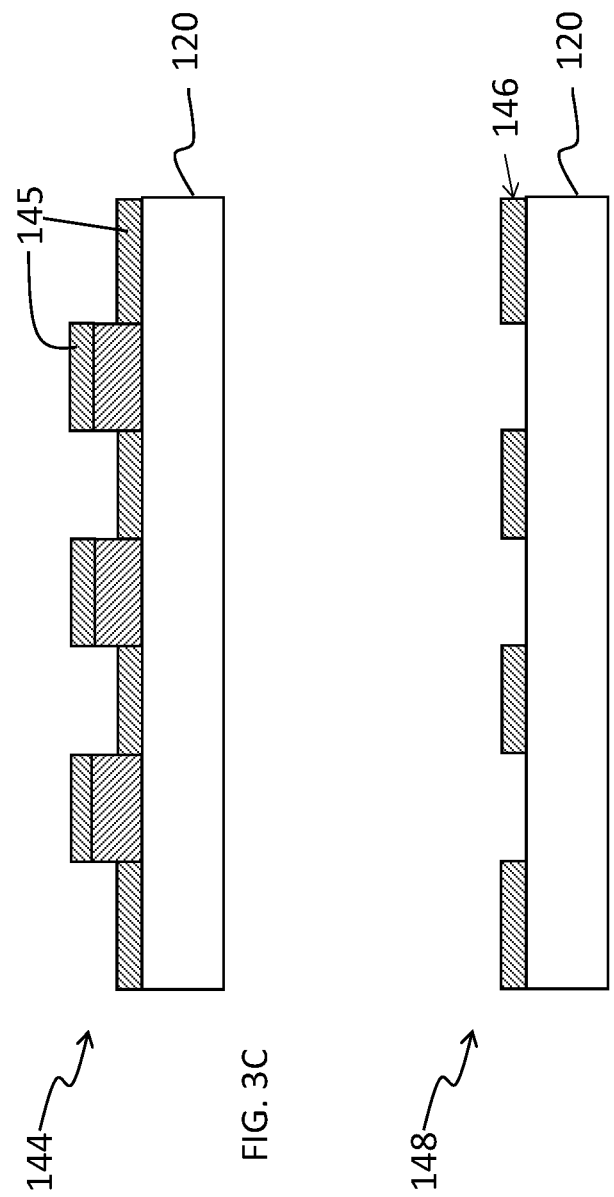

US 9,500,948 B2

FLUORINATED PHOTORESIST WITH INTEGRATED SENSITIZER

CROSS REFERENCE TO RELATED APPLICATIONS

This application claims the benefit of U.S. Provisional Application No. 61/829,523 and U.S. Provisional Application No. 61/829,536, both filed May 31, 2013. The entire disclosures of both of the Provisional Applications are hereby incorporated herein by reference.

STATEMENT REGARDING FEDERALLY-SPONSORED RESEARCH OR DEVELOPMENT

This invention was made in part with Government support under SBIR Phase II Grant No. 1230454 awarded by the National Science Foundation (NSF). The government may have certain rights in the invention.

BACKGROUND

1. Field of the Invention

The present invention relates to fluorinated photopolymers having one or more photosensitizers incorporated into the polymer. Such photopolymers are particularly useful for patterning organic electronic and biological materials.

2. Discussion of Related Art

Organic electronic devices offer significant performance and price advantages relative to conventional inorganic-based devices. As such, there has been much commercial interest in the use of organic materials in electronic device fabrication. Specifically, organic materials such as conductive polymers can be used to manufacture devices that have reduced weight and drastically greater mechanical flexibility compared to conventional electronic devices based on metals and silicon. Further, devices based on organic materials are likely to be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials are expected to be less expensive than devices based on conventional inorganic materials.

Fabrication of electronic devices, whether from organic or inorganic materials, requires the creation on an industrial scale of precisely defined patterns of the organic or inorganic active materials in these devices, often at a microscopic level. Most commonly, this is accomplished by "photolithography," in which a light-sensitive "photoresist" film that has been deposited on a substrate is exposed to patterned light. Although this can be done in numerous ways, typically a microscopic pattern of light and shadow created by shining a light through a photographic mask is used to expose the photoresist film, thereby changing the chemical properties of the portions of the photoresist that have been exposed to light. In a "positive" photoresist, the portions of the photoresist that are exposed to light become soluble in the "developer" solution that is then applied to the exposed photoresist, and the light-exposed portions of the photoresist are washed away ("developed") by the developer solvent to leave a pattern of unexposed photoresist and newly exposed underlying substrate. A "negative" photoresist is treated as for a positive photoresist; however, in a negative photoresist, it is the unexposed rather than the exposed portions of the photoresist that are washed away by the developing.

In a standard process, the photoresist material is laying on top of an active material layer that is to be patterned. Once the development has taken place, the underlying layer is etched using either a liquid etchant or a reactive ion plasma (RIE) with the appropriate etch chemistry. In either case, the photoresist layer blocks the etching of active material directly beneath it. Once the etching is complete, the resist is stripped away, leaving the pattern of active material on the substrate.

Alternatively, the photoresist can be used with a so-called "liftoff" technique. In this case, the resist is processed on a substrate before the active material layer is deposited. After the photoresist pattern is formed, the active material is deposited on both the substrate and the photoresist. In an additional "lift-off" or "stripping" step, remaining photoresist along with an overlying layer of active material is removed via the appropriate solvent to leave the desired patterned active material.

Although the use of photoresists is routine in traditional electronic devices based on inorganic materials, photolithography has been difficult to obtain for devices using organic materials, thereby hindering the development of devices based on these materials. Specifically, organic materials are much less resistant to the solvents that are used for conventional photolithography, as well as to the intense light sources that are used in these processes, with the result that conventional lithographic solvents and processes tend to degrade organic electronics. Although there have been various attempts to overcome these problems, e.g., by ink jet printing or shadow mask deposition, these alternative methods do not produce the same results as would be obtained with successful photolithography. Specifically, neither ink jet printing nor shadow mask deposition can achieve the fine pattern resolutions that can be obtained by conventional lithography, with ink-jet printing limited to resolutions of approximately 10-20 μm and shadow mask deposition to resolutions of about 25-30 μm.

US 2011/0159252 discloses a useful method for patterning organic electronic materials by an "orthogonal" process that uses fluorinated solvents and fluorinated photoresists. The fluorinated solvents have very low interaction with organic electronic materials.

Although the orthogonal process has made good progress, these fluorinated systems not always have sufficient sensitivity to the exposing radiation, especially in the range of 330 to 450 nm. Many conventional photoresist compositions include a photosensitizing additive, commonly referred to as a sensitizer or sensitizing dye, to increase the photosensitivity of the photoresist at a particular wavelength. By varying the amount of sensitizer added to the photoresist, the photo speed and spectral sensitivity of the system can be modulated. An important technical limitation of most existing sensitizers is that they are not highly soluble in fluorinated coating solvents or fluorinated developing solutions. Consequently, the concentration of sensitizer that can be employed in fluorinated photoresist composition is very limited and development can leave behind a residue of the sensitizer. Secondly, some sensitizers are susceptible to sublimation during the baking process, thereby depleting the photoresist formulation of sensitizer. In addition, the sublimed sensitizer can coat the baking tools and then flake off during the subsequent processing, resulting in further problems in the system.

In light of the above, there is a need to provide a more effective sensitization for use with fluorinated photoresists/fluorinated solvent systems.

SUMMARY

In accordance with the present disclosure, a method of patterning a device comprises: providing on a device substrate a layer of a fluorinated photopolymer comprising at least three distinct repeating units including a first repeating unit having a fluorine-containing group, a second repeating unit having an acid- or alcohol-forming precursor group, and a third repeating unit having sensitizing dye, wherein the photopolymer has a total fluorine content in a range of 15 to 60% by weight; exposing the photopolymer layer to patterned light to form an exposed photopolymer layer; contacting the exposed photopolymer layer with a developing agent to remove a portion of the exposed photopolymer layer in accordance with the patterned light, thereby forming a developed structure having a first pattern of photopolymer covering the substrate and a complementary second pattern of uncovered substrate corresponding to the removed portion of photopolymer, the developing agent comprising at least 50% by volume of a fluorinated solvent.

In accordance with another aspect of the present disclosure, a composition comprises: a fluorinated solvent; and a fluorinated photopolymer comprising at least three distinct repeating units, including a first repeating unit having a fluorine-containing group, a second repeating unit having an acid- or alcohol-forming precursor group, and a third repeating unit having a sensitizing dye, wherein the photopolymer has a total fluorine content in a range of 15 to 60% by weight.

In an embodiment, the compositions of the present disclosure have improved light sensitivity relative similar compositions without the third repeating unit, thereby requiring less exposure energy. When used to pattern other light-sensitive materials, the reduced light exposure may reduce photo degradation. In an embodiment, the improved light sensitivity may further enable reducing the amount of optional photo-acid generator (PAG). In an embodiment, incorporation of the sensitizing dye into the copolymer may overcome solubility problems of related, small molecule sensitizing dye compounds that are otherwise difficult to incorporate into the system in effective amounts.

BRIEF DESCRIPTION OF DRAWINGS

FIG. 1 is a flow chart depicting the steps in an embodiment of the present invention;

FIG. 2A-2F is a series of cross-sectional views depicting various stages in the formation of a patterned active organic material structure according to an embodiment of the present invention;

FIG. 3A-3D is a series of cross-sectional views depicting various stages in the formation of a patterned active organic material structure according to another embodiment of the present invention.

DETAILED DESCRIPTION

Figure 2D:
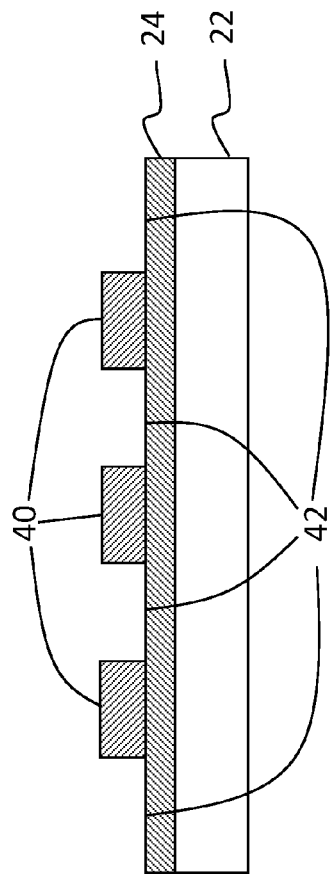

It is to be understood that the attached drawings are for purposes of illustrating the concepts of the invention and may not be to scale.

A photopolymer includes a light-sensitive material that can be coated to produce a photo-patternable film. In an embodiment, photopolymers of the present disclosure may be used to pattern a layer of some useful material in a device, e.g., a multilayer electronic device, and the photopolymer may optionally be removed (stripped). In an embodiment, photopolymers of the present disclosure may remain as part of a device and be used to form, e.g., a patterned a dielectric film or a water and/or oil repellent structure. The photopolymers described herein are sometimes referred to as "photoresists", but the photopolymers can have uses other than in photolithography, as would be readily apparent to one skilled in the art. That is, the term "photoresist" as used to describe materials of the present disclosure is not limited to photosensitive polymers used only in photolithography. An embodiment of the present disclosure is directed to improved polymeric, fluorinated photoresists (fluorinated photopolymers) that incorporate a sensitizing dye moiety as part of the polymer. The photopolymer is particularly suited for coating and developing using fluorinated solvents. The solvents for the fluorinated photopolymer solution, the developing solution and optional stripping solution are each chosen to have low interaction with other material layers that are not intended to be dissolved or otherwise damaged. Such solvents and solutions are collectively termed "orthogonal". This can be tested by, for example, immersion of a device comprising the material layer of interest into the solvent or solution prior to operation. The solvent or solution is orthogonal if there is no serious reduction in the functioning of the device. Unless otherwise noted, the term "solution" is used broadly herein to mean any flowable material. Examples of "solutions" include, but are not limited to: single solvent liquids; homogeneous mixtures of a solvent with one or more other solvents, with one or more solutes, and combinations thereof; and heterogeneous or multi-phase mixtures such as emulsions, dispersions and the like.

Certain embodiments disclosed in the present disclosure are particularly suited to the patterning of solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials, medical materials and biological materials (including bio-electronic materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

The photoresist compositions of the present disclosure are provided in a coating solution including at least 50% by volume of a fluorinated solvent (the term "a fluorinated solvent" includes a mixture of fluorinated solvents), preferably at least 90% by volume. An exposed photoresist layer can be developed using a developing solution including at least 50% by volume of a fluorinated solvent, preferably at least 90% by volume. Similarly, a developed (patterned)

photoresist layer can optionally be stripped using a stripping solution including at least 50% by volume of a fluorinated solvent, preferably at least 90% by volume. The term "% by volume" generally refers to the volume of an individual solvent measured prior to mixing relative to the total volume of a final solution or mixture. In the case of a photopolymer coating solution, however, the term "% by volume" refers to the volume of an individual solvent relative to the total volume of all other solvents and does not include the volume of the photopolymer. Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (PFCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water and most (but not necessarily all) organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs, and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE 7600 aka Novec™ 7600), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxy)benzene (HFE-978m), 1,2-(1,1,2,2-tetrafluoroethoxy) ethane (HFE-578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE60-C3).

The fluorinated photopolymer composition of the present disclosure includes a fluorinated solvent and a fluorinated photopolymer material. The fluorinated photopolymer comprises at least three distinct repeating units, including a first repeating unit having a fluorine-containing group, a second repeating unit having an acid- or alcohol-forming precursor group, and a third repeating unit having a sensitizing dye, wherein the photopolymer has a total fluorine content in a range of 15 to 60% by weight. The term "repeating unit" is used broadly herein and simply means that there is at least one unit, typically more than one unit, on a polymer chain. The term is not intended to convey that there is necessarily any particular order or structure with respect to the other repeating units unless specified otherwise. When a repeating unit represents a low mol % of the combined repeating units, there may be only one unit on a polymer chain.

In an embodiment, at least one of the three specified repeat units is formed via a post-polymerization reaction. In this embodiment, an intermediate polymer (a precursor to the desired copolymer) is first prepared, said intermediate polymer comprising suitably reactive functional groups for forming one of more of the specified repeat units. For example, an intermediate polymer containing pendant carboxylic acid moieties can be reacted with a fluorinated alcohol compound in an esterification reaction to produce the specified fluorinated repeating unit. Similarly, a precursor polymer containing carboxylic acid moieties can be reacted with isobutylene to form an acid-forming precursor repeating units. In another example, a polymer containing a suitable leaving group such as primary halide can be reacted with a sensitizing dye compound bearing a phenol moiety to form a sensitizing dye-containing repeat unit via an etherification reaction. In addition to simple condensation reactions such as esterification and amidation, and simple displacement reactions such as etherification, a variety of other covalent-bond forming reactions well-known to practitioners skilled in the art of organic synthesis can be used to form any of the specified repeat units. Examples include palladium-catalyzed coupling reactions, "click" reactions, addition to multiple bond reactions, Wittig reactions, reactions of acid halides with suitable nucleophiles, and the like.

In an alternative embodiment, the first, second and third repeating units are formed directly by polymerization of three (or more) appropriate monomers each having a polymerizable group, rather than by attachment to an intermediate polymer. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl acetates. Although many of the embodiments below refer to polymerizable monomers, analogous structures and ranges are contemplated and within the scope of the present disclosure wherein one or more of the repeating units are formed instead by attachment to an intermediate polymer.

In an embodiment, the fluorinated photopolymer material includes a copolymer formed at least from a first monomer having a fluorine-containing group, a second monomer having an acid- or alcohol forming precursor group, and a third monomer having a sensitizing dye. Additional monomers may optionally be incorporated into the copolymer. The copolymer may optionally include multiple first monomers, multiple second monomers, or multiple third monomers, in addition to other functional monomers. The term copolymer includes oligomers in addition to higher MW polymers. The copolymer has a total fluorine content in a range of 15 to 60% by weight. In an embodiment, the total fluorine content is 30 to 60%, preferably 35 to 55%. The copolymer is suitably a random copolymer, but other copolymer types can be used, e.g., block copolymers, alternating copolymers, and periodic copolymers. The copolymer may be optionally blended with one or more other polymers, preferably other fluorine-containing polymers, provided that the total fluorine content of the blended polymers is in a range of 15 to 60% by weight, relative to the total weight of the blended polymers.

The first monomer is one capable of being copolymerized with the second and third monomers and has at least one fluorine-containing group. In an embodiment, at least 70% of the fluorine content of the copolymer (by weight) is derived from the first monomer. In another embodiment, at least 85% of the fluorine content of the copolymer (by weight) is derived from the first monomer. Although the other two monomers may include fluorine, and there can be performance advantages when they do, some fluorine-containing substituents can be expensive. In certain embodiments, therefore, it is useful from a cost standpoint to rely on the first monomer for most or all of the fluorine content, rather than also preparing fluorinated second and third monomers if their substituents have high cost. In an embodiment, the first monomer is provided in a range of 40 to 90% by weight relative to the copolymer, alternatively in a range of 50 to 90% by weight, and preferably in a range of 60 to 80% by weight.

The first monomer includes a polymerizable group and a fluorine-containing group. Some non-limiting examples of useful polymerizable groups include acrylates (e.g. acrylate, methacrylate, cyanoacrylate and the like), acrylamides, vinylenes (e.g., styrenes), vinyl ethers, vinyl acetates, and epoxides. The fluorine-containing group is preferably an alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone or monovalent heterocyclic group, or any other substituent that a skilled worker would readily contemplate that would not adversely affect the performance of the fluorinated photoresist. Throughout this disclosure, unless otherwise specified, any use of the term alkyl includes straight-chain, branched and cyclo alkyls. Preferably, the first monomer does not contain protic or charged substituents, such as hydroxy, carboxylic acid, sulfonic acid or the like.

In a preferred embodiment, the first monomer has a structure according to formula (1):

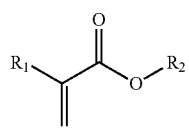

(1)

In formula (1), $R_1$ represents a hydrogen atom, a cyano group, a methyl group or an ethyl group. $R_2$ represents a substituted or unsubstituted alkyl group having at least 5 fluorine atoms, preferably at least 10 fluorine atoms. In an embodiment, the alkyl group is a hydrofluorocarbon or hydrofluoroether having at least as many fluorine atoms as carbon atoms. In a preferred embodiment $R_2$ represents a perfluorinated alkyl or a 1H,1H,2H,2H-perfluorinated alkyl having at least 4 carbon atoms. An example of the latter would be 1H,1H,2H,2H-perfluorooctyl (aka 2-perfluorohexyl ethyl), and a particularly useful first monomer includes 1H,1H,2H,2H-perfluorooctyl methacrylate ("FOMA") and similar materials.

The second monomer is one capable of being copolymerized with the first and third monomers. The second monomer includes a polymerizable group and either an acid-forming precursor group or an alcohol-forming precursor group. Some non-limiting examples of useful polymerizable groups include those described for the first monomer. Upon exposure to light, the acid- or alcohol-forming precursor group generates ("switches" to) a polymer-bound acid, e.g., a carboxylic or sulfonic acid, or alcohol, with release of a protecting group. This drastically changes its solubility relative to the unexposed regions thereby allowing development of an image. In an embodiment, a carboxylic acid-forming precursor is provided in a range of 10 to 60% by weight relative to the copolymer, alternatively in a range of 10 to 30% by weight.

One class of acid-forming precursor groups includes the non-chemically amplified type. An example of a second monomer with such a group is 2-nitrobenzyl methacrylate. With this class, the acid-forming precursor groups are directly photo-labile to form a carboxylic acid group. The non-chemically amplified acid-forming precursor may be sensitized by the sensitizing dye on the third monomer to improve photo-efficiency or shift the spectral sensitivity.

A second class of acid-forming precursor groups includes the chemically amplified type. This typically requires a photo-acid generator (PAG) to be added to the photoresist composition, e.g., as a small molecule additive to the solution. The sensitizing dye on the third monomer absorbs light and forms an excited state capable of reacting with a PAG to generate a proton (an acid). The acid catalyzes the deprotection of acid groups of the acid-forming precursor, optionally with a post exposure bake step. Chemically amplified resists can be particularly desirable since they enable the exposing step to be performed through the application of relatively low energy light exposure (typically under 100 mJ/cm$^2$). This is advantageous since many active organic materials useful in applications to which the present disclosure pertains may decompose in the presence of light, and therefore, reduction of the energy during this step permits the photoresist to be exposed without causing significant damage to underlying active organic layers. Also, decreased light exposure may be obtained by shorter exposure duration, improving the manufacturing throughput of the desired devices.

Examples of acid-forming precursor groups that yield a carboxylic acid include, but are not limited to: A) esters capable of forming, or rearranging to, a tertiary cation, e.g., t-butyl ester, 2-methyl-2-adamantyl ester, 1-ethylcyclopentyl ester and 1-ethylcyclohexyl ester; B) esters of lactone, e.g., γ-butyrolactone-3-yl, γ-butyrolactone-2-yl, mevalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters; E) alpha-cyclic ether esters; and F) MEEMA (methoxy ethoxy ethyl methacrylate) and other esters which are easily hydrolyzable because of anchimeric assistance. In a preferred embodiment, the second monomer comprises an acrylate-based polymerizable group and a tertiary alkyl ester acid-forming precursor group, e.g., t-butyl methacrylate (TBMA) or 1-ethylcyclopentyl methacrylate ("ECPMA").

The hydroxyl-forming precursor group (also referred to herein as an "alcohol-forming precursor group") includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the deprotection of the hydroxyl-forming precursor group, thereby forming a polymer-bound alcohol (hydroxyl group). This significantly changes the solubility of the photopolymer relative to the unexposed regions thereby allowing development of an image with the appropriate fluorinated solvent. In an embodiment, the developing solution includes a fluorinated solvent that selectively dissolves unexposed areas.

In an embodiment, the hydroxyl-forming precursor has a structure according to formula (2):

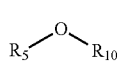

(2)

wherein $R_5$ is a carbon atom that forms part of the second repeating unit (or second polymerizable monomer), and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4).

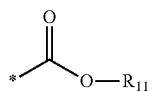
(AL-1)

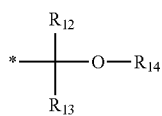
(AL-2)

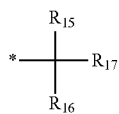
(AL-3)

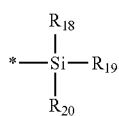
(AL-4)

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

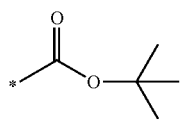
AL-1-1

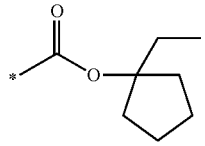
AL-1-2

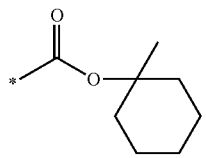
AL-1-3

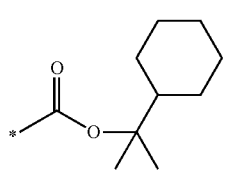
AL-1-4

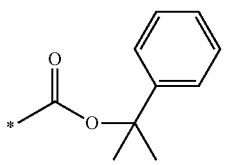
AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

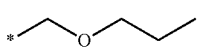
AL-2-1

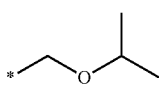
AL-2-2

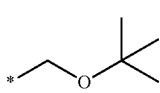
AL-2-3

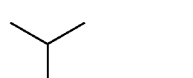
AL-2-4

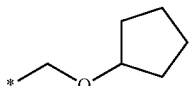
AL-2-5

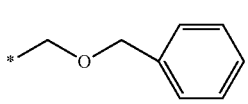
AL-2-6

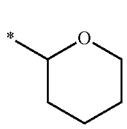
AL-2-7

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

AL-3-1

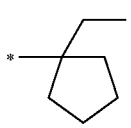
AL-3-2

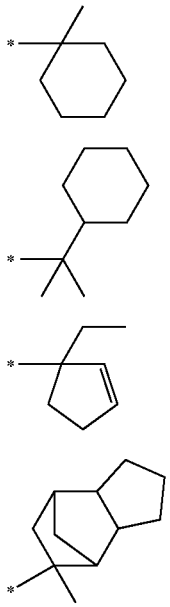

AL-3-3

AL-3-4

AL-3-5

AL-3-6

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

In a preferred embodiment, the developing solution includes a fluorinated solvent that selectively dissolves unexposed ("unswitched") areas of the photopolymer.

Many useful PAG compounds exist that may be added to a photoresist composition. The PAG should have some solubility in the coating solvent. The amount of PAG required depends upon the particular system, but generally, will be in a range of 0.1 to 6% by weight relative to the copolymer. In an embodiment, the presence of a sensitizing dye on the third monomer substantially reduces the amount of PAG required relative to a copolymer that does not incorporate the third monomer. In an embodiment, the amount of PAG is in a range of 0.1 to 2% relative to the copolymer. Fluorinated PAGs are generally preferred and non-ionic PAGs are particularly useful. Some useful examples of PAG compounds include 2-[2,2,3,3,4,4,5,5-octafluoro-1-(nonafluorobutylsulfonyloxyimino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-norbornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium, perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

The third monomer is one capable of being copolymerized with the first and second monomers. The third monomer includes a polymerizable group and a sensitizing dye. Herein, the term "sensitizing dye" refers to a light-absorbing group having a photoexcited state that is capable of reacting with a PAG to generate free acid in a chemically amplified system, or capable of reacting directly with the acid-forming precursor group of second monomer to form a polymer-bound acid. The sensitizing dye can be an inorganic metal complex or an organometallic, but it is preferably an organic material.

An advantage of the present disclosure is that, by incorporating the sensitizing dye into the fluorinated polymer, the dye no longer needs to be readily soluble in the coating or developing (or stripping) solvents. While a small molecule dye may have these issues, the fluorination level of the copolymer is such that it is still readily soluble, even after incorporation of the dye. Nevertheless, in some embodiments, it is useful if the third monomer includes some amount fluorination. By doing so, the level of incorporation of sensitizing dye can be further increased thereby improving the photo-speed while maintaining a wide process window for developing and stripping steps. In addition, the presence of "free" small molecule sensitizing dye may adversely affect some active organic materials. By attaching the sensitizing dye, this risk is substantially reduced.

In an embodiment, third monomer has no fluorine atoms and is provided in a range of 1 to 10% by weight relative to the copolymer. In another embodiment, the third monomer has no fluorine atoms and is provided in a range of 1 to 6% by weight relative to the copolymer. In a preferred aspect of this embodiment, the third monomer is provided in a range of 1 to 4% by weight relative to the copolymer.

In an embodiment, the third monomer includes one or more fluorine atoms (a fluorinated third monomer). The fluorine atoms can be included as part of the polymerizable group or as part of the sensitizing dye. Fluorine can be attached to an alkyl, aryl or heteroaryl moiety. In an embodiment, the third monomer has three or more fluorine atoms attached to an alkyl group. In an embodiment, a fluorinated third monomer is provided in a range of 1 to 20% by weight relative to the copolymer. In another aspect of this embodiment, the fluorinated third monomer is provided in a range of 5 to 15% by weight relative to the copolymer.

In an embodiment, the sensitizing dye has a light absorption peak in a range of 330 to 450 nm (as measured in a deposited film or in a fluorinated solvent solution). Although other wavelengths can be used, this range is compatible with many of the photolithographic, mercury lamp exposure units available in the industry that use i-line, h-line or g-line exposures. Many of the fluorinated photoresist systems of the prior art are designed for shorter wavelength radiation and have poor efficiency in this wavelength range. In an embodiment, the sensitizing dye enables sensitization of more than just i-line, h-line or g-line alone. For example, the sensitizing dye may have a light absorption peak in a range of 405 to 436 nm, and preferably, the light absorption at 405 nm is in a range of 0.33 to 3 times, preferably 0.5 to 2 times, the light absorption at 436 nm. Such a system has good sensitivity to both h-line and g-line radiation.

Some non-limiting examples of useful sensitizing dye classes include cyanine dyes, rhodamine compounds, dialkylaminobenezes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, pyrelenes, and pyrenes.

In an embodiment, the third monomer includes a polymerizable group and a coumarin-based sensitizing dye. In an embodiment, the third monomer has a structure according to formula (3):

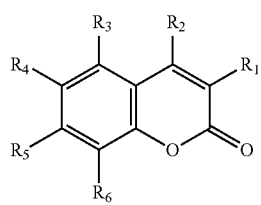

(3)

wherein at least one of substituents $R_1$ through $R_6$ is a polymerizable group and the remaining substituents independently represent a hydrogen atom, a halogen atom, a cyano group, or a substituted or unsubstituted alkyl, alkoxy, alkylthio, aryl, aryloxy, amino, alkanoate, benzoate, alkyl ester, aryl ester, alkanone, alkyl sulfone, aryl sulfone or monovalent heterocyclic group.

In an embodiment, $R_1$ or $R_2$ may represent an electron withdrawing group, e.g., an alkyl ester, an aryl ester, a fluorine-substituted alkyl or a cyano group. Alternatively, or in combination, one or more of substituents $R_3$ through $R_6$ may represent an electron donating group, e.g., an alkoxy, an aryloxy or an amino group. Such modifications may advantageously shift the absorbance to longer wavelengths. In an embodiment, $R_1$ is a polymerizable group, and one or both of $R_3$ and $R_5$ represent an alkoxy group that optionally includes at least one fluorine atom.

In an embodiment, the polymerizable group of the third monomer is an acrylate and has a structure according to formula (4):

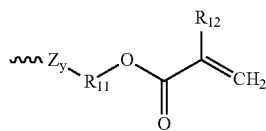

(4)

wherein $R_{11}$ represents a substituted or unsubstituted alkyl or aryl group, and $R_{12}$ represents a hydrogen atom, a cyano group or a substituted or unsubstituted alkyl group having 6 or fewer carbon atoms, Z represents $-\!\!\!-\!\!\!\{O\}\!\!\!-\!\!\!$, $-\!\!\!-\!\!\!\{C(O)O\}\!\!\!-\!\!\!$, or $-\!\!\!-\!\!\!\{N(R_{13})\}\!\!\!-\!\!\!$, y=0 or 1, and $R_{13}$ represents a hydrogen atom or a substituted or unsubstituted alkyl or aryl group.

In an embodiment, the third monomer has a structure according to formula (5):

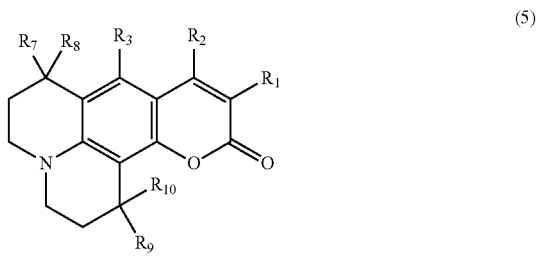

(5)

wherein $R_7$ through $R_{10}$ independently represent a hydrogen atom or a substituted or unsubstituted alkyl group and $R_1$ through $R_3$ are defined in as in formula (3). Many coumarin sensitizing dyes according to formula (5) have significant photosensitivity at g-line (436 nm).

Some non-limiting examples of the third monomer include:

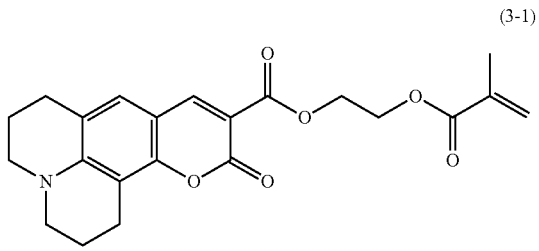

(3-1)

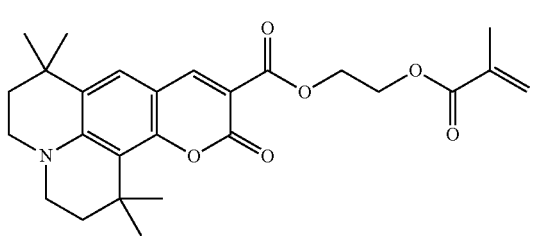

(3-2)

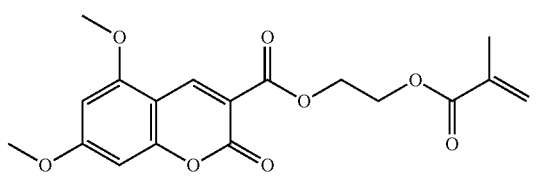

(3-3)

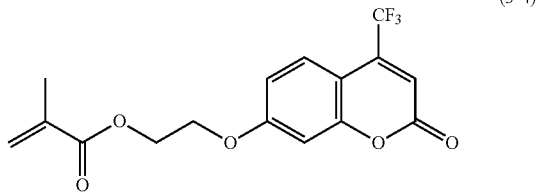

(3-4)

(3-5)
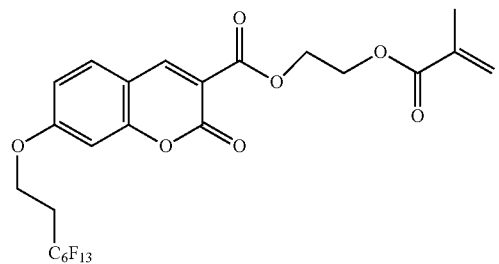
(3-6)
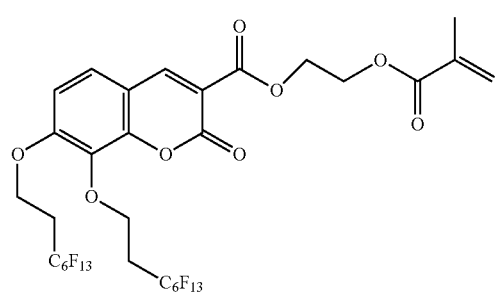
(3-7)
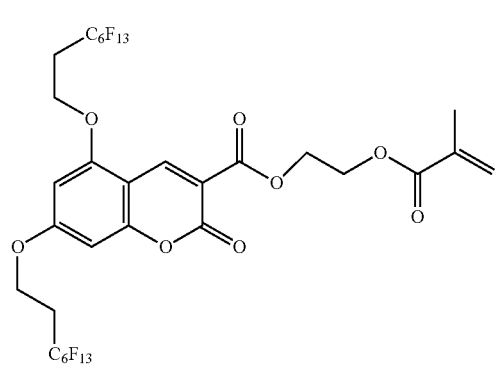
(3-8)
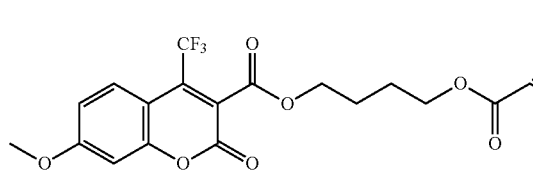
(3-9)
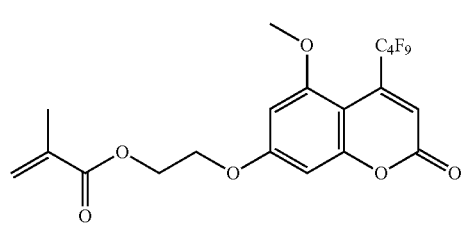
(3-10)
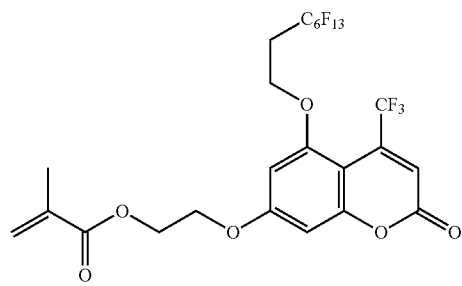
(3-11)
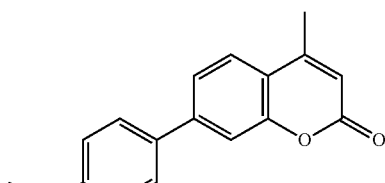
(3-12)
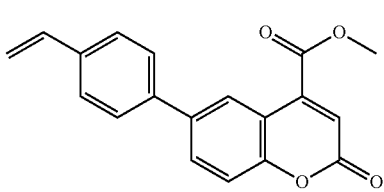
(3-13)
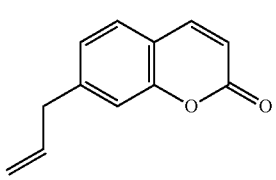
(3-14)
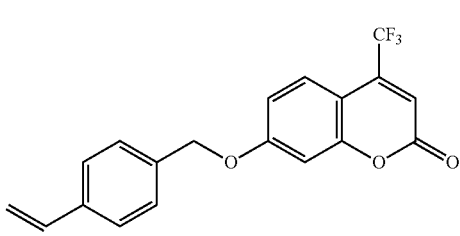
(3-15)
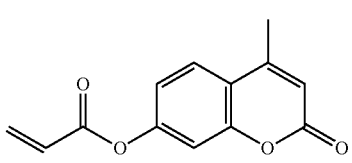
(3-16)
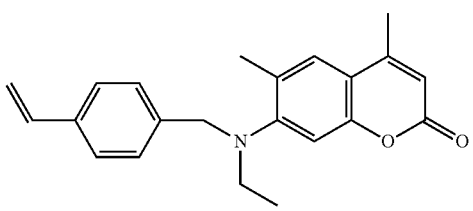
(3-17)
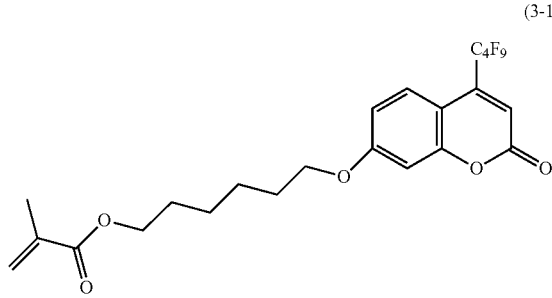

-continued (3-18)

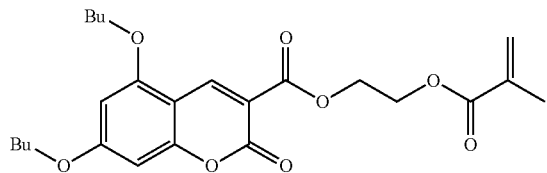

Preparation and polymerization of the monomers discussed above can generally be achieved using standard synthetic methods known to a skilled artisan. Some useful examples of the preparation of orthogonal photoresists can be found in US Publication No. 2011/0159252 and Application No. PCT/US2012/034748, the entire contents of which are incorporated herein by reference. Examples of the preparation of polymers incorporating sensitizing dyes can be found in U.S. Pat. Nos. 8,338,529, 5,250,395, 7,632,630, 5,650,456, and 5,286,803, the entire contents of which are incorporated herein by reference.

As previously mentioned, the composition of the present disclosure had many possible uses. A flow diagram for an embodiment of the present invention is shown in FIG. 1, and includes the step 2 of forming a photoresist layer on a substrate. This can be accomplished, for example, by depositing a photoresist composition of the present disclosure onto the substrate by spin coating, curtain coating, bead coating, bar coating, spray coating, dip coating or other methods capable of forming a film from a solution. The photoresist solution includes at least a fluorinated coating solvent and a fluorinated photopolymer material of the present disclosure dissolved or suspended in the coating solvent. Other additives may be present such as stabilizers, coating aids, acid scavengers ("quenchers") and the like. Alternatively, the photoresist layer can be formed on the substrate by transferring a preformed photoresist layer (including a fluorinated photoresist material) from a carrier sheet, for example, by lamination transfer using heat, pressure or both. In such an embodiment, the substrate or the preformed photoresist layer may optionally have coated thereon an adhesion promoting layer.

In step 6, a developed structure is formed that includes a first pattern of photoresist. This can be done by contacting the exposed photoresist layer to a developing solution. The developing solution includes at least 50% by volume of a fluorinated solvent, preferably a hydrofluoroether. During development, a portion of the exposed photoresist layer is removed in accordance with the patterned light. Depending on the nature of the chemical or physical change caused by the patterned light, the developing solution may dissolve the unexposed portion (negative working resist) or it may dissolve the exposed portion (positive working resist). In a preferred embodiment, the developing solution comprises a hydrofluoroether that dissolves the unexposed portion. In either case, it leaves behind a developed structure having a first pattern of photoresist that covers the substrate and a complementary second pattern of uncovered substrate corresponding to the removed portion of photoresist. By uncovered substrate, it is meant that the surface of the substrate is substantially exposed or revealed to a degree that it can be subjected to further treatments. Contacting the exposed photoresist layer can be accomplished by immersion into the developing solution or by coating it with the developing solution in some way, e.g., by spin coating or spray coating. The contacting can be performed multiple times if necessary.

Although formation of the developed structure could be the last patterning step if the photoresist layer is intended to remain in the device, the developed structure may be subjected to further steps as described below.

In step 8, a treated structure is optionally formed by treating the developed structure in some way. In an embodiment, the treating includes a chemical or physical etch of the second pattern of uncovered substrate. In this case, the first pattern of photoresist acts as an etch barrier. In another embodiment, the treating includes chemically modifying the surface of the second pattern of uncovered substrate or the first pattern of photoresist. In another embodiment, the treating includes oxidation, reduction or doping of the second pattern of uncovered substrate, e.g., to modify its conductivity. In yet another embodiment, the treating includes coating the developed structure with, for example, an active organic material that is deposited both on the surface of the first pattern of photoresist and on the second pattern of uncovered substrate. In any of the above embodiments, the substrate may optionally include an active organic material layer such that the uncovered substrate is the surface of that active organic material layer.

In step 10, the first pattern of photoresist is optionally removed from the treated structure using a stripping solution. The stripping solution preferably includes at least 50% by volume of a fluorinated solvent. In embodiments wherein the surface of the first pattern of photoresist is covered with another layer of material, e.g., an active organic material layer, that portion is also removed. This is sometimes referred to as a "lift off" process.

Figure 2E:
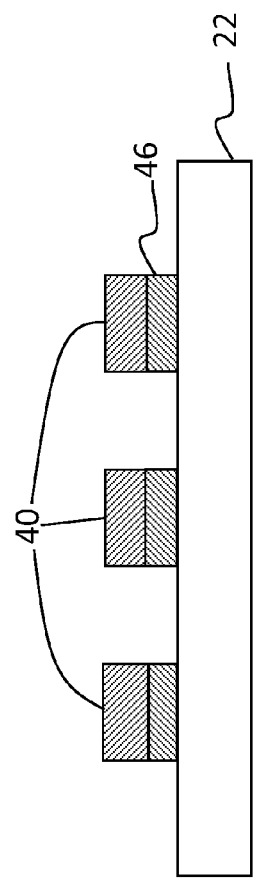
Figure 2F:
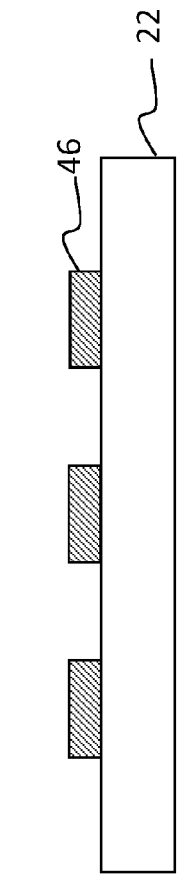

Turning now to FIG. 2, there is a series of cross-sectional views depicting the formation of a patterned active organic material structure at various stages according to an embodiment of the present invention. In FIG. 2A, a substrate 20 includes a layer of active organic material 24 provided on a support 22. In FIG. 2B, a negative-type photoresist layer 26 is formed on the substrate 20 and in contact with the layer of active organic material 24. Next, as shown in FIG. 2C, photoresist layer 26 is exposed to patterned light by providing a photomask 30 between the photoresist layer 26 and a source of collimated light 28. The exposed photoresist layer 32 includes exposed areas 34 and non-exposed areas 36. The structure is then developed in a developing solution including a fluorinated solvent. The non-exposed areas 36 of the photoresist are selectively dissolved to form a structure having a removed portion of photoresist. As shown in FIG. 2D, developed structure 38 has a first pattern of photoresist 40 covering the substrate, in this case the layer of active organic material 24, and a complementary second pattern of uncovered substrate 42, in this case the layer of active organic material 24, corresponding to the removed portion of photoresist. Turning now to FIG. 2E, a treated structure 44 is formed by subjecting the developed structure 38 to a chemical or physical etch that selectively removes active organic material from the second pattern of uncovered substrate, thereby forming a patterned layer of active organic material 46 corresponding to the first pattern. By corresponding, it is meant that the patterned layer of active organic material 46 substantially resembles that of the first pattern of photoresist 40, but the two patterns are not necessarily identical. For example, the etching might also etch the sidewalls of the patterned layer of active organic material, thereby making the dimensions slightly smaller than the first pattern. Conversely, etching kinetics or diffusion might be such that the dimensions of the patterned layer of active organic material are slightly larger than the first pattern. Further, the patterned layer of active organic material might not have vertical sidewalls as shown. Rather than rectangular, its cross section could resemble a trapezoid, an inverted trapezoid (undercut), or some other shape, e.g., one having curved sidewalls. Referring to FIG. 2F, treated structure 44 is contacted with a stripping solution that removes the first pattern of photoresist 40, thereby forming patterned active organic material structure 48 having the (now bare) patterned layer of active organic material 46. Patterned active organic material structure 48 may optionally be subjected to additional steps, if necessary, to form a functional device such as an organic TFT array, an OLED display, an e-reader, a solar cell, a bioelectronic device, a medical device and the like.

Figure 3A:
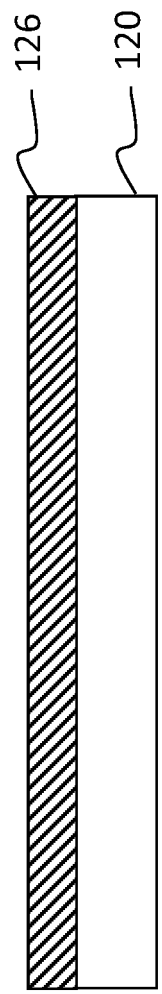
Figure 3B:
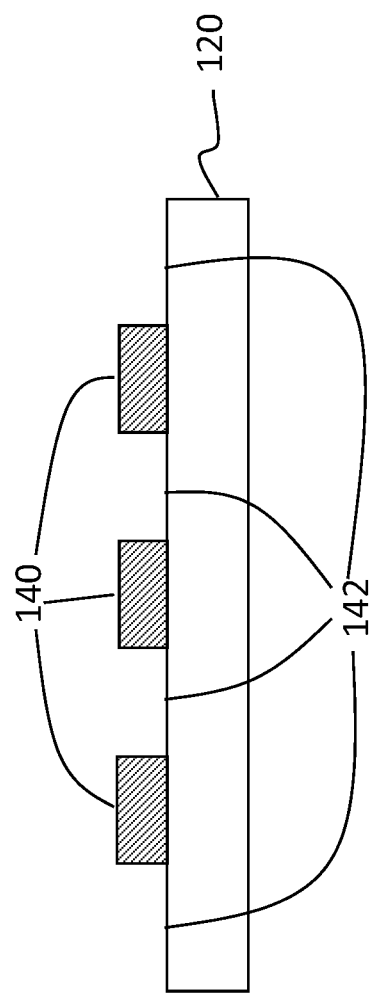

Turning now to FIG. 3, there is a series of cross-sectional views depicting the formation of a patterned active organic material structure at various stages according to another embodiment of the present invention. In FIG. 3A, a negative-type photoresist layer 126 is formed on substrate 120. This structure is then exposed and developed as described above to form developed structure 138, as shown in FIG. 3B. Developed structure 138 has a first pattern of photoresist 140 covering the substrate, and a complementary second pattern of uncovered substrate 142 corresponding to a removed portion of photoresist. Turning now to FIG. 3C, a treated structure 144 is formed by depositing a layer of active organic material 145 over both the first pattern of photoresist and the second pattern of uncovered substrate. In FIG. 3D, the treated structure 144 is then contacted with a stripping solution that removes the first pattern of photoresist and the active organic material deposited over the first pattern of photoresist, thereby forming patterned active organic material structure 148 having a patterned layer of active organic material 146 corresponding to the second pattern. By corresponding, it is meant that the patterned layer of active organic material 146 substantially resembles that of the second pattern of uncovered substrate 142, but the two patterns are not necessarily identical. Patterned active organic material structure 148 may optionally be subjected to additional steps, if necessary, to form a functional device such as an organic TFT array, an OLED display, an e-reader, a solar cell, a bioelectronic device, a medical device and the like.

In an embodiment, the developing solution and the stripping solution may each comprise a mixture of first and second fluorinated solvents, but at different ratios or concentrations. Preferably the fluorinated solvents are both hydrofluoroethers. In an embodiment, the first or second fluorinated solvent, or a mixture thereof, is also used as the coating solvent. The "mixed solvent" developing solution or the stripping solution may optionally be obtained at least in part from a recycled solvent mixture of the first and second solvents produced by a simple recycling apparatus acting on the photoresist waste stream as disclosed in co-pending U.S. 61/815,465, the teachings of which are incorporated by reference herein. Some non-limiting embodiments of the present disclosure are described below.

Embodiment 1. A method of patterning a device comprising: providing a layer of a fluorinated photopolymer over a device substrate, the fluorinated photopolymer comprising at least three distinct repeating units, including a first repeating unit having a fluorine-containing group, a second repeating unit having an acid- or alcohol-forming precursor group, and a third repeating unit having sensitizing dye, wherein the photopolymer has a total fluorine content in a range of 15 to 60% by weight; exposing the photopolymer layer to patterned light to form an exposed photopolymer layer; and contacting the exposed photopolymer layer with a developing agent to remove a portion of the exposed photopolymer layer in accordance with the patterned light, thereby forming a developed structure having a first pattern of photopolymer covering the substrate and a complementary second pattern of uncovered substrate corresponding to the removed portion of photopolymer, the developing agent comprising at least 50% by volume of a fluorinated solvent.

Embodiment 2. The method of embodiment 1 wherein the fluorinated solvent is a hydrofluoroether.

Embodiment 3. The method according to any of embodiments 1 or 2 wherein the photopolymer has a total fluorine content in a range of 30 to 60% by weight.

Embodiment 4. The method according to any of embodiments 1-3 wherein the device substrate comprises a support and a layer of active organic material, and wherein the fluorinated photopolymer layer is in contact with the layer of active organic material.

Embodiment 5. The method according to any of embodiments 1-4 further including: treating the developed structure to form a treated structure; and contacting the treated structure with a stripping agent to remove the first pattern of photopolymer.

Embodiment 6. The method according to embodiment 5 wherein the treating includes providing a layer of active organic material (a second active organic material in the case where the device substrate includes a layer of active organic material) over both the first pattern of photopolymer and the second pattern of uncovered substrate, wherein the removal of the first pattern of photopolymer further removes active organic material formed over the first pattern of photopolymer, thereby forming a patterned layer of active organic material corresponding to the second pattern.

Embodiment 7. The method according to any of embodiments 1-4 further including treating the developed structure to form a treated structure, wherein the treating includes chemical or physical etching of the active organic material in the second pattern of uncovered substrate, thereby forming a patterned layer of active organic material corresponding to the first pattern.

Embodiment 8. The method according to any of embodiments 1-7 wherein the sensitizing dye is a coumarin-based sensitizing dye.

Embodiment 9. The method according to any of embodiments 1-8 wherein the photopolymer is a copolymer formed from a first monomer having a fluorine-containing group, a second monomer having an acid- or alcohol-forming precursor group, and a third monomer having a structure according to formula (3):

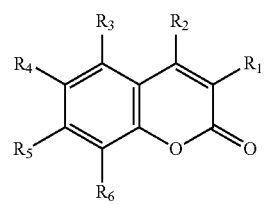

(3)

wherein at least one of substituents $R_1$ through $R_6$ is a polymerizable group and the remaining substituents independently represent a hydrogen atom, a halogen atom, a cyano group, or a substituted or unsubstituted alkyl, alkoxy, alkylthio, aryl, aryloxy, amino, alkanoate, benzoate, alkyl ester, aryl ester, alkanone, alkyl sulfone, aryl sulfone or monovalent heterocyclic group.

Embodiment 10. The method according to embodiment 9 wherein the total fluorine content of the copolymer is in a range of 35 to 55% by weight.

Embodiment 11. The method according to any of embodiments 9-10 wherein the first monomer is provided in a range of 60 to 80% by weight relative to the copolymer.

Embodiment 12. The method according to any of embodiments 9-11 wherein the first monomer is a fluoroalkyl acrylate.

Embodiment 13. The method according to any of embodiments 9-12 wherein the third monomer has no fluorine atoms and wherein the third monomer is provided in a range of 1 to 4% by weight relative to the copolymer.

Embodiment 14. The method according to any of embodiments 9-12 wherein the third monomer has one or more fluorine atoms and wherein the third monomer is provided in a range of 1 to 20% by weight relative to the copolymer.

Embodiment 15. The method according to any of embodiments 9-14 wherein the second monomer is a carboxylic acid-forming precursor and is provided in a range of 10 to 30% by weight relative to the copolymer.

Embodiment 16. The method according to any of embodiments 1-15 wherein the fluorinated solvent is selected from the group consisting of an isomeric mixture of methyl nonafluorobutyl ether and methyl nonafluoroisobutyl ether, an isomeric mixture of ethyl nonafluorobutyl ether and ethyl nonafluoroisobutyl ether, 3-ethoxy-1,1,1,2,3,4,4,5,5,6,6,6-dodecafluoro-2-trifluoromethyl-hexane, 1,1,1,2,3,3-hexafluoro-4-(1,1,2,3,3,3,-hexafluoropropoxy)-pentane, 1-methoxyheptafluoropropane, 1,1,1,2,2,3,4,5,5,5-decafluoro-3-methoxy-4-trifluoromethyl-pentane, 1,3-(1,1,2,2-tetrafluoroethoxy)benzene, 1,2-(1,1,2,2-tetrafluoroethoxy)ethane, 1,1,2,2-tetrafluoroethyl-1H,1H,5H-octafluoropentyl ether, 1,1,2,2-tetrafluoroethyl-2,2,2-trifluoroethyl ether, 1,1,2,2-tetrafluoroethyl-2,2,3,3-tetrafluoropropyl ether, and 1,1,1,2,2,3,3,4,4,5,5,6,6-tridecafluorooctane-propyl ether.

Embodiment 17. A composition comprising: a fluorinated solvent; and fluorinated photopolymer comprising at least three distinct repeating units, including a first repeating unit having a fluorine-containing group, a second repeating unit having an acid- or alcohol-forming precursor group, and a third repeating unit having a sensitizing dye, wherein the photopolymer has a total fluorine content in a range of 15 to 60% by weight.

Embodiment 18. The composition according to embodiment 17 wherein the sensitizing dye is a coumarin-based sensitizing dye.

Embodiment 19. The composition according to embodiment 18 wherein the fluorinated photopolymer is formed from a first monomer having a fluorine-containing group, a second monomer having an acid-forming or alcohol-forming precursor group, and a third monomer having a structure according to formula (3):

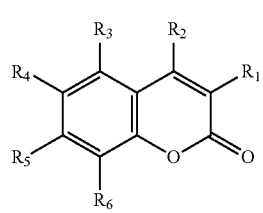

(3)

wherein at least one of substituents $R_1$ through $R_6$ is a polymerizable group and the remaining substituents independently represent a hydrogen atom, a halogen atom, a cyano group, or a substituted or unsubstituted alkyl, alkoxy, alkylthio, aryl, aryloxy, amino, alkanoate, benzoate, alkyl ester, aryl ester, alkanone, alkyl sulfone, aryl sulfone or monovalent heterocyclic group.

Embodiment 20. The composition according to embodiment 19 wherein $R_1$ is a polymerizable group, and one or both of $R_3$ and $R_5$ is an alkoxy group.

Embodiment 21. The composition of according to embodiment 20 wherein the alkoxy group of one or both of $R_3$ and $R_5$ includes at least one fluorine atom.

Embodiment 22. The composition according to any of embodiments 17-21 wherein the fluorinated solvent is a hydrofluoroether.

Embodiment 23. The composition according to any of embodiments 17-22 wherein the photopolymer has a total fluorine content in a range of 30 to 60% by weight.

Embodiment 24. Using the composition according to any of embodiments 17-23 to pattern one or more layers of a device.

EXAMPLES

Third monomers (3-2), (3-3), (3-4), (3-5), (3-6) and (3-7), each having coumarin-based sensitizing dyes, were prepared and tested.

Preparation of Third Monomer (3-2)

As a first intermediate in the preparation of third monomer (3-2), 10,10,16,16-tetramethyl-4-oxo-3-oxa-13-azatetracyclo[7.7.1.0$^{2,7}$.0$^{13,17}$]heptadeca-1,5,7,9(17)-tetraene-5-carbonyl chloride was prepared as follows A stirred suspension of 10,10,16,16-tetramethyl-4-oxo-3-oxa-13-azatetracyclo[7.7.1.0$^{2,7}$.0$^{13,17}$]heptadeca-1,5,7,9(17)-tetraene-5-carboxylic acid (12.11 g, 35 mmol, prepared according to U.S. Pat. No. 4,736,032) and two drops of N,N-dimethylformamide in 80 mL of dichloromethane was treated under nitrogen with oxalyl chloride (4.95 g, 39 mmol). After 18 h, NMR analysis of the mixture indicated that the reaction was only partially complete. An additional 3.0 g of oxalyl chloride was added, and the mixture was heated at reflux for 4 h. Volatiles were removed in a stream of nitrogen, and the orange product was dried in vacuo.

Next, a stirred solution under nitrogen of 10,10,16,16-tetramethyl-4-oxo-3-oxa-13-azatetracyclo[7.7.1.0$^{2,7}$.0$^{13,17}$] heptadeca-1,5,7,9(17)-tetraene-5-carbonyl chloride (12.76 g, 35.5 mmol) and few mg 4,4'-thiobis(2-methyl-6-tert-butylphenol) (inhibitor) in 40 mL of trifluorotoluene was cooled in ice bath and treated with a solution of 2-hydroxyethyl methacrylate (5.54 g, 22.6 mmol), triethylamine (5.38 g, 53.2 mmol), and 4-dimethylaminopyridine (0.433 g, 3.6 mmol) in 40 mL of the same solvent. The mixture was gradually warmed to ambient overnight, heated at 60° C. for 4 h, and then cooled. The mixture was diluted with dichloromethane, and washed successively with 1 M aqueous hydrochloric acid and with brine. The organic layer was dried over magnesium sulfate, filtered, and concentrated. The product was purified by column chromatography on silica gel, eluting with a mixture of heptane and ethyl acetate, followed by recrystallization from isopropanol to provide 7.48 g (47% of theory) of an orange solid.

Preparation of Third Monomer (3-3)

As a first intermediate in the preparation of third monomer (3-3), 5,7-dimethoxycoumarin-3-carboxylic acid was prepared as follows. A mixture of 2.14 g (11.7 mmol) of 2-hydroxy-4,6-dimethoxybenzaldehyde, 1.78 g (12.3 mmol) of 2,2-dimethyl-1,3-dioxane-4,6-dione, 0.05 g of piperidine, 0.035 g of acetic acid, and 10 mL of absolute ethanol was heated at reflux with magnetic stirring under nitrogen for 6 h and then cooled to ambient. The resulting precipitate was collected, washed with methanol, and dried to provide 2.63 g (89% yield) of a light yellow solid. This first intermediate was characterized by $^1$H NMR: (300 MHz, DMSO-d6) 3.88 (s, 3 H), 3.92 (s, 3 H), 6.51 (d, 1 H), 6.61 (d, 1 H), 8.60 (s, 1 H).

As a second intermediate, 5,7-dimethoxycoumarin-3-carbonyl chloride was prepared as follows. A mixture of 2.63 g (11 mmol) of 5,7-dimethoxycoumarin-3-carboxylic acid, 25 mL (350 mmol) of thionyl chloride, and 4 drops of N,N-dimethylformamide was heated at reflux with magnetic stirring under nitrogen for 4 h. Excess thionyl chloride was removed in a stream of nitrogen, and the solid residue was recrystallized from toluene to provide 1.90 g (67% yield) of a light yellow powder. This second intermediate was characterized by $^1$H NMR: (300 MHz, CDCl3) 3.93 (s, 3 H), 3.98 (s, 3 H), 6.31 (d, 1 H), 6.42 (d, 1 H), 9.12 (s, 1 H).

Next, a stirred solution of 1.45 g (11 mmol) of 2-hydroxyethylmethacrylate, 1.13 g (11 mmol) of triethylamine, 0.06 g (0.5 mmol) in 20 mL of dichloromethane was cooled in an ice bath under nitrogen and treated dropwise with a solution of 2.50 g (9.3 mmol) of 5,7-dimethoxycoumarin-3-carbonyl chloride in 20 mL dichloromethane. The mixture was allowed to warm slowly to ambient and then washed successively with 1 M hydrochloric acid and with water, dried over magnesium sulfate, and concentrated to deposit a crude product. A small amount of 2,6-di(t-butyl)-4-methylphenol (inhibitor) was added, and the product was purified by successive recrystallizations from 1:1 toluene:heptane and from acetonitrile to provide 2.50 g (74%) of a pale yellow solid. The product was characterized by $^1$H NMR: (300 MHz, CDCl3) 1.97 (s, 3 H), 3.89 (s, 3 H), 3.93 (s, 3 H), 4.48 (m, 2 H), 4.58 (m, 2 H), 5.60 (t, 1 H), 6.17 (s, 1 H), 6.28 (d, 1 H), 6.42 (d, 1 H), 8.82 (s, 1 H).

Preparation of Third Monomer (3-4)

As an intermediate in the synthesis third monomer (3-4), 7-(2-hydroxyethoxy)-4-trifluoromethylcoumarin was prepared as follows. A stirred mixture of 1.79 g (7.8 mmol) of 7-hydroxy-4-trifluoromethylcoumarin, 0.75 g (8.6 mmol) of ethylene carbonate, 1.45 g (4.4 mmol) of cesium carbonate, and 30 mL of N,N-dimethylformamide was heated for 3 days under nitrogen in an 80° C. oil bath. The reaction mixture was cooled to ambient and poured into water. The precipitated crude product was collected, washed with water, and dried. After recrystallization from a mixture of toluene and heptane, 1.01 g (47% yield) of a white solid was obtained. This intermediate was characterized by $^1$H NMR: (300 MHz, CDCl3) 2.00 (t, 1 H), 4.04 (m, 2 H), 4.18 (t, 2 H), 6.64 (s, 1 H), 6.90-6.98 (m, 2 H), 7.64 (d, 1 H).

Next, a mixture of 0.012 g (0.6 mmol) of molybdenum dioxide dichloride and 1.35 g (8.8 mmol) of methacrylic anhydride was stirred in 10 mL of dichloromethane under nitrogen for 30 min. A solution of 1.60 g (5.8 mmol) of 7-(2-hydroxyethoxy)-4-trifluoromethylcoumarin was added slowly, and the mixture was stirred for 2 h. Methanol (5 mL) was added, and stirring was continued 2 h. The resulting solution was diluted with dichloromethane, and treated with 5 g of potassium carbonate. After stirring 1 h, the mixture was filtered, washed successively with water and brine, dried over magnesium sulfate, filtered, and concentrated. The residue was recrystallized from 2-propanol to obtain 1.24 g (62% yield) of a colorless powder in two crops. The product was characterized by $^1$H NMR: (300 MHz, CDCl3) 1.96 (s, 3 H), 4.31 (t, 2 H), 4.55 (t, 2 H), 5.62 (m, 1 H), 6.15 (s, 1 H), 6.64 (s, 1 H), 6.90-6.97 (m, 2 H), 7.64 (dd, 1 H).

Preparation of Third Monomer (3-5)

As a first intermediate, ethyl 7-hydroxy-3-coumarincarboxylate was prepared as follows. A stirred mixture of 2,4-dihydroxybenzaldehyde (5.00 g, 36 mmol), diethyl malonate (6.38 g, 409 mmol), piperidine (0.15 g, 2 mmol), acetic acid (0.11 g, 2 mmol), and 20 mL absolute ethanol was heated at reflux under nitrogen for 48 g. After cooling to ambient, the reaction mixture 50 mL of 0.5 M aqueous hydrochloric acid was added. The precipitated product was collected, dried, and then recrystallized from toluene to afford 5.20 g (61% of theory) of product.

Next, 7-(3,3,4,4,5,5,6,6,7,7,8,8,8-tridecafluorooctyloxy)-3-coumarincarboxylic acid was prepared as follows. To a stirred mixture under nitrogen of ethyl 7-hydroxy-3-coumarincarboxylate (2.70 g, 12 mmol), cesium carbonate (4.13 g, 13 mmol), and 45 mL of acetonitrile was added 1,1,1,2,2,3,3,4,4,5,5,6,6-tridecafluoro-8-(trifluoromethylsulfonyloxy)octane (6.29 g, 13 mmol, prepared by the method of Koshti et al., *Synthetic Communications* 2002, 32, 3779, and purified by distillation at reduced pressure). The mixture was heated at reflux 18 h, cooled to ambient, and poured into 200 mL of 0.2 M aqueous hydrochloric acid. The resulting precipitate was mixed with 40 mL of tetrahydrofuran, 20 mL of ethanol, 20 mL of water and 2.0 g of cesium carbonate and heated at reflux 6 h. After cooling to ambient, the mixture was poured into 200 mL of 1 M aqueous hydrochloric acid. The precipitated product was collected, washed with water, dried, and then purified by recrystallization from 2-propanol to provide 3.21 g (50% of theoretical) of a light yellow solid.

As a next step, 7-(3,3,4,4,5,5,6,6,7,7,8,8,8-tridecafluorooctyloxy)-3-coumarincarbonyl chloride was prepared as follows. A stirred suspension of 7-(3,3,4,4,5,5,6,6,7,7,8,8,8-tridecafluorooctyloxy)-3-coumarincarboxylic acid (3.21 g, 6 mmol) and 4 drops of N,N-dimethylformamide in 14 mL of thionyl chloride (190 mmol) was heated at reflux under nitrogen for 4 h, and then cooled to ambient. Excess thionyl chloride was removed in a stream of nitrogen, and the solid residue was recrystallized from toluene to afford 2.73 g (82% of theory) of the product.

Third monomer (3-5) was then prepared as follows. A stirred solution of 7-(3,3,4,4,5,5,6,6,7,7,8,8,8-tridecafluorooctyloxy)-3-coumarincarbonyl chloride (2.73 g, 4.8 mmol) and a few mg 4,4'-thiobis(2-methyl-6-tert-butylphenol) (inhibitor) in 20 mL trifluorotoluene (TFT) was cooled in an ice bath under nitrogen. A solution of 2-hydroxyethyl methacrylate (0.75 g, 5.7 mmol), triethylamine (0.73 g, 7.2 mmol), and 4-dimethylaminopyridine (0.058 g, 0.5 mmol) in 10 mL of the same solvent was added dropwise. The mixture was gradually warmed to ambient overnight, then diluted with dichloromethane and washed successively with 1 M aqueous hydrochloric acid and with water. The organic layer was dried over magnesium sulfate, filtered, and concentrated to deposit a light yellow solid. The product was purified by recrystallization from 50 mL 80/20 (v/v) toluene/heptane to provide 2.58 g (81% of theory) of the product.

Preparation of Third Monomer (3-6)

As a first step ethyl 5,7-dihydroxy-3-coumarincarboxylate was prepared as follows. A stirred mixture of phlorglucinol (6.57 g, 52 mmol), diethyl ethoxymethylenemalonate (12.39 g, 5.7 mmol), and 50 mL of absolute ethanol was treated with zinc chloride (8.88 g, 65 mmol) and heated under nitrogen at reflux for 22 h. After cooling to ambient, the reaction mixture was poured into 100 mL of 0.1 M aqueous hydrochloric acid. The precipitate was collected, washed with water, and dried to afford 1.60 g (12% of theory) of the product as a red solid.

Next, ethyl 5,7-bis(3,3,4,4,5,5,6,6,7,7,8,8,8-tridecafluorooctyloxy)-3-coumarincarboxylate was prepared as follows. To a mixture of ethyl 5,7-dihydroxy-3-coumarincarboxylate (1.60 g, 6.4 mmol), cesium carbonate (6.25 g, 13 mmol), and 30 mL of acetonitrile was added 1,1,1,2,2,3,3,4,4,5,5,6,6-tridecafluoro-8-(trifluoromethylsulfonyloxy)octane (6.25 g, 19 mmol, prepared by the method of Koshti et al., *Synthetic Communications* 2002, 32, 3779, and purified by distillation at reduced pressure). The mixture was heated at reflux 18 h, cooled to ambient, diluted with dichloromethane, filtered, and concentrated. The residue was recrystallized from acetonitrile to afford 2.94 g (49% of theory) of the product as a yellow solid.

As a next step, 5,7-bis(3,3,4,4,5,5,6,6,7,7,8,8,8-tridecafluorooctyloxy)-3-coumarincarboxylic acid was prepared as described herein. A suspension of ethyl 5,7-bis(3,3,4,4,5,5,6,6,7,7,8,8,8-tridecafluorooctyloxy)-3-coumarincarboxylate (2.94 g, 3 mmol) in a solution comprising potassium hydroxide (0.21 g, 4 mmol), tetrahydrofuran (10 mL), ethanol (5 mL) and water (5 mL) was heated under nitrogen at 65° C. for 6 h and then cooled to ambient. The mixture was partially concentrated in a stream of nitrogen, and 25 mL of 1 M aqueous hydrochloric acid was added. The precipitate was collected, washed with water and dried to afford 2.52 g (88% of theory) of the product as a yellow solid.

Next, 5,7-bis(3,3,4,4,5,5,6,6,7,7,8,8,8-tridecafluorooctyloxy)-3-coumarincarbonyl chloride was prepared as follows. 5,7-bis(3,3,4,4,5,5,6,6,7,7,8,8,8-tridecafluorooctyloxy)-3-coumarincarboxylic acid (2.52 g, 2.8 mmol) was suspended in a mixture of thionyl chloride (3.28 g, 2.8 mmol), four drops of N,N-dimethylformamide, and dichloromethane (20 mL). The mixture was heated at reflux for 4 h, and then cooled to ambient. Excess thionyl chloride and dichloromethane were evaporated in a stream of nitrogen. Analysis by NMR indicated that conversion was incomplete, so the residue was suspended in 10 mL of dichloromethane and treated with 1.5 mL of oxalyl chloride. After heating under nitrogen at 40° C. for 4 h, the mixture was cooled to ambient and volatiles were removed as before. The residue was recrystallized from toluene to afford 2.25 g (88% of theory) of a tan solid.

Third monomer (3-6) was then prepared as described below. A stirred solution under nitrogen of 5,7-bis(3,3,4,4,5,5,6,6,7,7,8,8,8-tridecafluorooctyloxy)-3-coumarincarbonyl chloride (2.25 g, 2.4 mmol) and few mg 4,4'-thiobis(2-methyl-6-tert-butylphenol) (inhibitor) in 20 mL of , ,-trifluorotoluene was cooled in ice bath and treated with a solution of 2-hydroxyethyl methacrylate (0.38 g, 2.9 mmol), triethylamine (0.37 g, 3.6 mmol), and 4-dimethylaminopyridine (0.029 g, 0.24 mmol) in 10 mL of the same solvent. The mixture was gradually warmed to ambient overnight, then diluted with dichloromethane, and washed successively with 1 M aqueous hydrochloric acid and with water. The organic layer was dried over magnesium sulfate, filtered, and concentrated. The product was purified by column chromatography on silica gel, eluting with a mixture of heptane and ethyl acetate, followed by recrystallization from isopropanol to provide 1.15 g (46% of theory) of a yellow solid.

Preparation of Third Monomer (3-7)

As a first step, ethyl 7,8-dihydroxy-3-coumarincarboxylate was prepared as follows. A stirred mixture of 2,3,4-trihydroxybenzaldehyde (15.24 g, 99 mmol), diethyl malonate (19.0 g, 119 mmol), piperidine (1.68 g, 0.2 mmol), and 50 mL of absolute ethanol was heated at reflux under nitrogen for 44 h, and then cooled to ambient. The reaction mixture was poured onto 200 mL of 0.5 M aqueous hydrochloric acid. The precipitate was collected, washed with water, and dried to afford 14.84 g (60% of theory) of the product as a yellow solid Next, ethyl 7,8-bis(3,3,4,4,5,5,6,6,7,7,8,8,8-tridecafluorooctyloxy)-3-coumarincarboxylate was prepared as follows. To a mixture of ethyl 7,8-dihydroxy-3-coumarincarboxylate (5.00 g, 20 mmol), cesium carbonate (14.3 g, 50 mmol), and 50 mL of acetonitrile was added 1,1,1,2,2,3,3,4,4,5,5,6,6-tridecafluoro-8-(trifluoromethylsulfonyloxy)octane (20.82 g, 42 mmol, prepared by the method of Koshti et al., *Synthetic Communications* 2002, 32, 3779, and purified by distillation at reduced pressure). The mixture was heated at reflux 6 h, cooled to ambient, and poured into 150 mL of 0.2 M aqueous hydrochloric acid. The precipitate was collected, washed with water, and dried to afford 17.6 g (93% of theory) of the product as a tan solid.

As a next step 7,8-bis(3,3,4,4,5,5,6,6,7,7,8,8,8-tridecafluorooctyloxy)-3-coumarincarboxylic acid was prepared as follows. A mixture of ethyl 7,8-bis(3,3,4,4,5,5,6,6,7,7,8,8,8-tridecafluorooctyloxy)-3-coumarincarboxylate (17.6 g, 19 mmol), potassium hydroxide (4.4 g, 78 mmol) in 50 mL tetrahydrofuran, 25 mL ethanol, and 25 mL of water was heated for 4 h at 65° C. After cooling to ambient, the reaction mixture was poured into 300 mL of 1 M aqueous hydrochloric acid. The precipitate was collected, washed with water, and dried to afford 16.0 g (94% of theory) of the product as a tan solid.

Third monomer (3-7) was then prepared as follows. A stirred mixture under nitrogen of 7,8-bis(3,3,4,4,5,5,6,6,7,7,8,8,8-tridecafluorooctyloxy)-3-coumarincarboxylic acid (16.0 g, 17.5 mmol), 2-hydroxyethyl methacrylate (2.73 g, 21.0 mmol), 4-dimethylaminopyridinium tosylate (0.52 g, 1.8 mmol, prepared by the method of Moore and Stupp, *Macromolecules* 1990, 23, 65) was treated with diisopropyl carbodiimide (2.43 g, 19.2 mmol). After stirring at ambient for 18 h, the mixture was partially concentrated in a stream of nitrogen, diluted with dichloromethane, and washed successively with 1 M aqueous hydrochloric acid and with brine. The organic layer was dried over magnesium sulfate, filtered, and concentrated. The product was purified by chromatography on silica gel, eluting with a mixture of heptane and ethyl acetate, followed by recrystallization from acetonitrile to provide 8.86 g (48% of theory) of a light yellow solid.

Preparation of Third Monomer (3-18)

As a first step, 2,4-dibutoxy-6-hydroxybenzaldehyde was prepared as follows. A mixture of 2,4,6-trihydroxybenzaldehyde (7.20 g, 47 mmol, synthesized by the method of Lawrence, et al. *Organic Letters* 2010, 12(8), 1676), 1-iodobutane (17.2 g, 93 mmol), potassium carbonate (12.9 g, 93 mmol), and 75 mL of 2-butanone was stirred and heated under nitrogen for 16 h, then cooled to ambient. The reaction mixture was diluted with acetone and filtered. The filtrate was concentrated, and then partitioned between 75 mL each of diethylether and water. The aqueous layer was separated and extracted twice with diethylether. The combined ethereal extracts were washed with brine, dried over magnesium sulfate, filtered, and concentrated. The residue was distilled at reduced pressure to afford 3.15 g (25% of theory) of the product as a colorless oil.

Next, 5,7-dibutoxy-3-coumarincarboxylic acid was prepared as follows. A mixture 2,4-dibutoxy-6-hydroxybenzaldehyde (3.15 g, 12 mmol), 2,2-dimethyl-1,3-dioxane-4,6-dione (1.88 g, 13 mmol), 10 drops of piperidine, and 20 mL acetonitrile was stirred 48 h at room temperature. The precipitated product was collected, washed quickly with cold acetonitrile, and dried. A light yellow solid was obtained, mass 2.25 g (57% of theory).

As a next step, 5,7-dibutoxy-3-coumarincarbonyl chloride was prepared. A stirred solution of 5,7-dibutoxy-3-coumarincarboxylic acid (2.25 g, 7 mmol), 4 drops of N,N-dimethylformamide, and 20 mL dichloromethane at room temperature under nitrogen was treated with oxalyl chloride (1.28 g, 10 mmol). The solution was stirred for 2 h, then heated in 40° C. oil bath for 4 h. After cooling to ambient, volatiles were removed in a stream of nitrogen. The residue was recrystallized from a mixture of toluene and heptane to provide 2.06 g (87% of theory) of the product as a yellow solid.

Third monomer (3-18, 2-(5,7-dibutoxy-3-coumarinylcarbonyloxy)ethyl methacrylate) was then prepared. A stirred solution under nitrogen of 5,7-dibutoxy-3-coumarincarbonyl chloride (2.07 g, 5.9 mmol) and few mg 4,4'-thiobis(2-methyl-6-tert-butylphenol) (inhibitor) in 15 mL of dichloromethane was treated with a solution of 2-hydroxyethyl methacrylate (0.92 g, 7.0 mmol), triethylamine (0.89 g, 8.8 mmol), and 4-dimethylaminopyridine (0.07 g, 0.6 mmol) in 15 mL of the same solvent. The mixture was heated at 40° C. for 4 h, and then cooled to ambient. The mixture was diluted with dichloromethane, and washed successively with 1 M aqueous hydrochloric acid and with brine. The organic layer was dried over magnesium sulfate, filtered, and concentrated. The product was purified by recrystallization from isopropanol to provide 2.26 g (86% of theory) of a light yellow solid.

Photopolymer Composition Preparation

Photopolymer Compositions 1A & 1B—No Sensitizing Dye (Comparative)

A copolymer solution was formed from the polymerization of: FOMA as a first monomer and TBMA as a second monomer. No third monomer (no sensitizing dye) was present. The relative ratios of the two monomers were 49.6/50.4 mol %, respectively, and the polymerization was carried out in a hydrofluoroether solvent (HFE-7600). Details of the preparation are provided below.

A clean, dry 1 L four-neck jacketed reactor was equipped with a Teflon-blade mechanical stirrer, a reflux condenser having a mineral oil bubbler, a nitrogen inlet (the height of which could be adjusted to be below the surface of the reaction solution), and a programmable constant temperature bath (CTB) attached to the reactor jacket. To the reactor was charged FOMA (165.2 g, 0.382 mol), TBMA (55.1 g, 0.387 mol), AIBN (4.40 g, 0.0268 mol) and Novec™ 7600 solvent (437.5 g). The nitrogen inlet was placed below the surface of the solution, and with good stirring, the reaction solution was sparged with nitrogen for 1 h. During the nitrogen sparge, the CTB was pre-warmed to 78° C. with the flow to the reactor jacket turned off. When the sparge was complete, the gas inlet tube was raised above the solution level and the nitrogen flow was reduced to maintain a slow flow through the system during the reaction. The valves between the pre-heated CTB and the reactor were opened and the reaction solution was stirred with heating for 18 h. The CTB was set to 21° C., and when the polymer solution was cooled, a total of 1178 g of Novec™ 7600 was added to the polymer solution to rinse it out of the reactor and to achieve a suitable viscosity for coating operations. A sample of the polymer solution could be removed at that point and either stripped of solvent or precipitated in cold methanol to provide a sample for analytical testing.

Under yellow lights, an appropriate amount of PAG CGI-1907 ("ONPF") from BASF can be added. Depending on the experiment, the PAG level was either 0.8% (Photopolymer Composition 1A) or 3.0% (Photopolymer Composition 1B) by weight relative to the photopolymer weight. The PAG slowly dissolves in the photopolymer solution over approximately 30 minutes. The light-sensitive solution can be filtered using nitrogen pressure through a 0.05 micrometer cartridge filter to provide a solution for coating.

Photopolymer Composition 2—No Sensitizing Dye (Comparative)

Photopolymer Composition 2 was prepared in HFE-7600 in a similar fashion to Photopolymer Composition 1 and had a mol ratio of FOMA and TBMA of 50.0/50.0 —slightly different from Photopolymer Composition 1. Photopolymer Composition 2 included 0.8% PAG CGI-1907.

Photopolymer Composition 3—Made with Compound (3-3) (Inventive)

A copolymer solution was formed from the polymerization of: FOMA as a first monomer, TBMA as a second monomer and Compound (3-3) as a third monomer. The relative ratios of the three monomers were 49/49/2 mol %, respectively, and the polymerization was carried out in a hydrofluoroether solvent (HFE-7600). The total fluorine content of the copolymer was 41.9% by weight (relative to the total copolymer weight). Photopolymer Composition 3 included 0.8 wt % PAG (relative to the copolymer weight), added to the solution. The following procedure was used.

A jacketed reactor was charged with 20.0 g (46 mmol) of FOMA, 6.58 g (46 mmol) TBMA, 0.69 g (1.9 mmol) of Compound 3-3, and 64.5 g of Novec™ 7600. The mixture was deaerated by sparging with nitrogen for 20 min, then 0.36 g (1.9 mmol) of 2,2'-azobis(2-methylbutyronitrile) (AMBN) was added. Recirculating water at 70° C. was introduced to the jacket while keeping the mixture under a nitrogen atmosphere and stirring at 150 rpm. The temperature of the circulating water was raised to 80° C. over 30 min, held for 19 h and then cooled to ambient. The contents of the reactor were drained, and the residue rinsed out with 46 g additional Novec™ 7600 in two portions. The combined solutions provided a solution of the photoresist polymer containing 20% solids. PAG CGI 1907 was added at 0.8 wt %.

Photopolymer Composition 4—Made with Compound (3-4) (Inventive)

A copolymer solution was formed from the polymerization of: FOMA as a first monomer, TBMA as a second monomer and Compound (3-4) as a third monomer. The relative ratios of the three monomers were 50/48/2 mol %, respectively, and the polymerization was carried out in a hydrofluoroether solvent (HFE-7600). The total fluorine content of the copolymer was 42.7% by weight (relative to the total copolymer weight). Photopolymer Composition 4 included 1.0 wt % PAG CGI-1907 (relative to the copolymer weight), added to the solution.

Photopolymer Composition 4 was prepared in a similar manner to Photopolymer Composition 3 except as follows.

The jacketed reactor was charged with 7.1712 (16.5931 mmoles) of FOMA, 2.2745 g (15.9951 mmoles) of TBMA, 0.2300 g (0.6720 mmoles) of Compound (3-4), 25 g Novec™ 7600, and 0.1956 g (1.1912 mmoles) of 2,2'-azobis (2-methylpropionitrile) (AIBN). The mixture was deaerated by sparging with nitrogen for 30 minutes at room temperature. The reaction was then heated at 78° C. for 18 hours. After cooling to room temperature, the product was isolated by precipitating into cold methanol, decanting off the solvent, and then drying the residual solid in a vacuum oven at 40° C. The photoresist polymer was re-dissolved in Novec™ 7600 to form a 12 wt % solution of the polymer. PAG CGI 1907 was added at 1.0% by weight relative to the polymer.

Additional photopolymer compositions described below were prepared using methods analogous to those described above with respect to Photopolymer Compositions 3 and 4.

Photopolymer Composition 5—Made with Compound (3-5) (Inventive)

A copolymer solution was formed from the polymerization of: FOMA as a first monomer, TBMA as a second monomer and Compound (3-5) as a third monomer. The relative ratios of the three monomers were 50/48/2 mol %, respectively, and the polymerization was carried out in a hydrofluoroether solvent (HFE-7600). Photopolymer Composition 5 further included 0.8 wt % PAG CGI-1907 (relative to the copolymer weight), added to the solution.

Photopolymer Composition 6—Made with Compound (3-6) (Inventive)

A copolymer solution was formed from the polymerization of: FOMA as a first monomer, TBMA as a second monomer and Compound (3-6) as a third monomer. The relative ratios of the three monomers were 50/48/2 mol %, respectively, and the polymerization was carried out in a hydrofluoroether solvent (HFE-7600). Photopolymer Composition 6 further included 0.8 wt % PAG CGI-1907 (relative to the copolymer weight), added to the solution.

Photopolymer Composition 7—Made with Compound (3-7) (Inventive)

A copolymer solution was formed from the polymerization of: FOMA as a first monomer, TBMA as a second monomer and Compound (3-7) as a third monomer. The relative ratios of the three monomers were 49/49/2 mol %, respectively, and the polymerization was carried out in a hydrofluoroether solvent (HFE-7600). Photopolymer Composition 7 further included 0.8 wt % PAG CGI-1907 (relative to the copolymer weight), added to the solution.

Photopolymer Composition 8—Made with Compound (3-3) (Inventive)

A copolymer solution was formed from the polymerization of: FOMA as a first monomer, TBMA as a second monomer and Compound (3-3) as a third monomer. The relative ratios of the three monomers were 50/48/2 mol %, respectively (slightly different from Photopolymer Composition 3), and the polymerization was carried out in a hydrofluoroether solvent (HFE-7600). Photopolymer Composition 8 included 0.8 wt % PAG CGI-1907 (relative to the copolymer weight), added to the solution.

Photopolymer Composition 9—Made with Compound (3-4) (Inventive)

A copolymer solution was formed from the polymerization of: FOMA as a first monomer, TBMA as a second monomer and Compound (3-4) as a third monomer. The relative ratios of the three monomers were 50/48/2 mol %, respectively, and the polymerization was carried out in a hydrofluoroether solvent (HFE-7600). Photopolymer Composition 9 included 0.8 wt % PAG CGI-1907 (relative to the copolymer weight), added to the solution.

Photopolymer Composition 10—Made with Compound (3-2) (Inventive)

A copolymer solution was formed from the polymerization of: FOMA as a first monomer, TBMA as an acid-forming precursor second monomer, TMSOEMA (2-(trimethylsilyloxy)ethyl methacrylate) as an alcohol forming second monomer and Compound (3-2) as a third monomer. The relative ratios of the four monomers were 48/30/20/2 mol %, respectively, and the polymerization was carried out in a hydrofluoroether solvent (HFE-7600). Photopolymer Composition 10 included 3.0 wt % PAG CGI-1907 (relative to the copolymer weight), added to the solution.

Photopolymer Composition 11—No Sensitizing Dye (Comparative)

This composition was like Photopolymer Composition 10, except without the sensitizing dye. The copolymer solution was formed from the polymerization of: FOMA as a first monomer, TBMA as an acid-forming precursor second monomer, and TMSOEMA as an alcohol forming second monomer. The relative ratios of the three monomers were 50/30/20 mol %, respectively, and the polymerization was carried out in a hydrofluoroether solvent (HFE-7600). Photopolymer Composition 11 included 3.0 wt % PAG CGI-1907 (relative to the copolymer weight), added to the solution.

Photopolymer Composition 12—Made with Compound (3-18) (Inventive)

A copolymer solution was formed from the polymerization of: FOMA as a first monomer, TBMA as a second monomer and Compound (3-18) as a third monomer. The relative ratios of the three monomers were 49/49/2 mol %, respectively, and the polymerization was carried out in a hydrofluoroether solvent (HFE-6512). Photopolymer Composition 12 further included 0.8 wt % PAG CGI-1907 (relative to the copolymer weight), added to the solution.

Photolithographic Evaluation

A silicon wafer was primed by vapor treatment with hexamethyldisoloxane (HMDS). Each fluorinated photoresist solution was spin-coated onto the silicon wafer and then "soft baked" at 90° C. for 60 seconds. The photoresist layer was about 1.0 to 1.5 μm thick. The photoresist was exposed through a reticle to patterned UV radiation (365 nm) with doses ranging from 40 mJ/cm$^2$ to 880 mJ/cm$^2$, followed by post-exposure baking at 90° C. for 60 seconds. The exposed photoresist was then developed in Novec™ 7300 developing agent to remove the unexposed portion and to form a photoresist pattern on the substrate. Development times are shown in Table 1. Two applications of developer (approximately 10 mL each) were provided onto the photoresist layer to form a "puddle," and the dwell time of each application was half of the total development time specified in Table 1. The wafer was spun dry at the end of each dwell time and the lithographic performance was evaluated, as shown in Table 1. After development, all samples were successfully stripped using two (2) 60 second puddles of Novec™ 7600, even at the highest exposure dose of 880 mJ/cm$^2$.

TABLE 1

| Example Type | Photopolymer Composition (Third Monomer) | PAG wt % | Development time (sec) | Minimum exposure dose to form good image (mJ/cm$^2$) |
| --- | --- | --- | --- | --- |
| Comp. 1 | 1 (none) | 0.8 | 120 | 187 |

TABLE 1-continued

| Example Type | Photopolymer Composition (Third Monomer) | PAG wt % | Development time (sec) | Minimum exposure dose to form good image (mJ/cm$^2$) |
|---|---|---|---|---|
| Comp. 2 | 1 (none) | 3.0 | 120 | 68 |
| Inv. 1 | 3 (3-3) | 0.8 | 200 | <40 |
| Inv. 2 | 4 (3-4) | 1.0 | 180 | <40 |

The data in Table 1 show that the inventive examples (Inv. 1 and Inv. 2) with integrated sensitizing dyes have improved photo-speed, i.e., the minimum exposure energy dose needed to achieve a good developed image is lower than that for the photoresist not having the integrated sensitizer. This is true, even though the PAG level in comparative example Comp. 2 is at least three times higher than the PAG level in each inventive example.

Film photo-speed, development rate and contrast were quantified using a step tablet. The following method was used, which can be modified as needed. A subject fluorinated photopolymer was spin coated onto a silicon wafer and soft-baked for 1 min at 90° C. The film thickness was generally in a range of about 1 to 1.5 µm. An optical 22 step tablet (~0.15 density units per step) was laid on top of the wafer and the resist was exposed to 365 nm radiation using a 16W black light lamp. The maximum exposure dose was typically about 175 mJ/cm$^2$, but for films having lower sensitivity the dose was increased. The wafer was post-exposure baked (PEB) for 1 min at 90° C. to activate the switching reaction. The film thickness was then immediately measured in 24 areas (steps). In addition to the 22 areas of the step tablet, the maximum exposure dose was measured just outside of the step tablet area (point 1) as well as a minimum exposure dose area (covered by a metal disc) that received no exposure (point 24).

Five minutes after the PEB, the wafer was contacted with ~10 mL of a developer solution by forming a "puddle" over the wafer and spin-dried after the target time was reached. The time of each puddle and number of puddles depended on the system, but a typical series was: 15 sec, 15 sec (30 sec total), 30 sec (60 sec total), 30 sec (90 sec total), 30 sec (120 sec total), and 60 sec (180 sec total). After each puddle, the film thicknesses were measured in the same 24 areas. Film thicknesses after each puddle were normalized to the starting thickness and plotted versus log Exposure (log(E)) to create a set of contrast curves. The contrast between each point was calculated using equation 1:

$$\text{Contrast} = [\Delta \text{ normalized thickness}]/[\Delta \log(E)] \quad (\text{Eq. 1})$$

Figure 4:
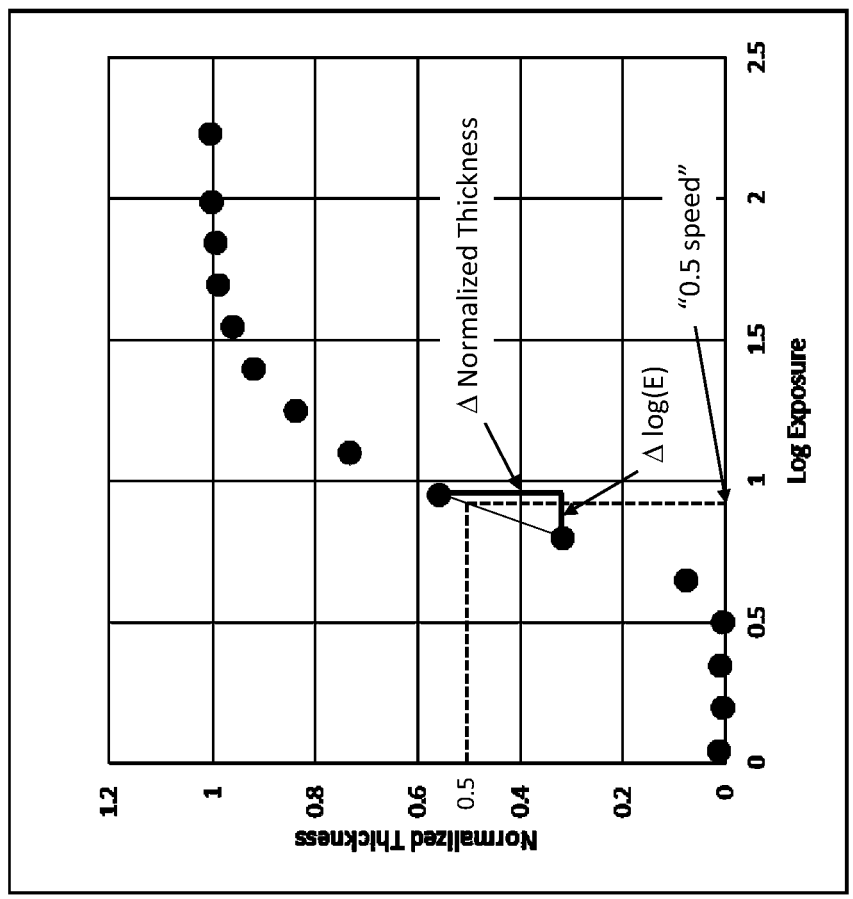
FIG. 4 is a representative plot of normalized thickness vs. log (exposure) used to determine photopolymer contrast.

The highest calculated contrast (the "maximum contrast") for each curve was determined. FIG. 4 shows an example graph of normalized thickness vs. log(E)—for clarity, only the first 16 points are shown. Other parameters can also be determined as desired such as "0.5 speed" (exposure dose at normalized density=0.5 for first contrast curve to fully clear in the minimum exposure step ("Emin")—also shown in FIG. 4), "Emax erosion" (normalized thickness loss of the maximum exposure ("Emax") point 1 during development), "clear rate" (dissolution rate of minimum exposure in nm/sec), and "time to strip" (time it takes for maximum exposure to be fully removed).

The contrast of the present fluorinated photopolymer system is an important factor that depends both upon the photopolymer and upon the developing solution. Higher contrast is typically preferred, as it generally results in straighter, more vertical sidewalls for imaged areas and overall better discrimination between imaging light and stray light for improved feature resolution. For good imaged line shapes in some embodiments, it is desirable that the maximum contrast be at least 1.5, preferably at least 1.9 and more preferably at least 2.1. In an embodiment, the developing is solution and development time is selected to provide a maximum photopolymer contrast in a range of 1.9 to 5.0.

Various fluorinated photopolymer compositions, all having 0.8% CGI-1907 PAG, were coated, exposed using the step tablet and developed using Novec™ 7300 hydrofluoroether solvent as the developing agent as described above. The results are shown in Table 2. Spectra were also obtained for the compositions (without PAG) coated on glass and the absorbance at 365 nm per micron film thickness for each film is also reported in Table 2.

TABLE 2

| Example Type | Photopolymer Composition (Third Monomer) | Abs per µm @ 365 nm | Emin clear rate (nm/s) | 0.5 speed (mJ/cm$^2$) | Contrast at various dev times | | | |
|---|---|---|---|---|---|---|---|---|
| | | | | | 60 s | 90 s | 120 s | 180 s |
| Comp. 3 | 2 (none) | ~0 | 30.6 | 167 | 2.4 | x | z | z |
| Inv. 3 | 8 (3-3) | 0.33 | 10.4 | 3.33 | y | y | 1.4 | 1.8 |
| Inv. 4 | 9 (3-4) | 0.02 | 18.4 | 48.6 | y | 2.0 | 2.2 | z |
| Inv. 5 | 5 (3-5) | 0.13 | 18.7 | 8.96 | y | 1.8 | 2.8 | z |
| Inv. 6 | 6 (3-6) | 0.12 | 20.9 | 51.9 | 1.5 | 2 | 2.9 | z |
| Inv. 7 | 7 (3-7) | 0.12 | 26.8 | 15.1 | 2.3 | 2.7 | 4.0 | z |
| Inv. 8 | 12 (3-18) | 0.17 | 14.7 | 3.57 | 1.5 | 2.4 | 2.3 | 5.2* | x = Emax dissolved too much for reliable measurement
y = Emin not yet cleared
z = not measured
*slight delamination at ~9 mJ/cm$^2$ exposure energy Table 2 shows that incorporation of a sensitizing dye can significantly increase film speed, i.e., reduces the exposure necessary to retain 0.5 normalized film thickness. The comparative example Comp. 3 was given a maximum exposure of 280 mJ/cm$^2$ but even that exposure was not holding at 90 sec of development; about 35% of the Emax step had dissolved. Inv. 3 is particularly effective at increasing film speed (50× more sensitive). It was a little slow to develop (lower clear rate) relative to Comp. 3, but the authors have found in related studies that development rate and contrast can be increased by using a stronger developing agent, e.g., HFE-7200, or mixture of solvents, e.g., a mixture of HFE-7300 or HFE-7500 with 1 to 10% by volume of HFE-7600 or HFE-6512.

It is also noted that the sensitizing dyes having fluorinated groups have higher clear rates than the non-fluorinated Compound (3-3). Inv. 7 is structurally most similar to Inv. 3 and the fluorination has allowed an almost full recovery of clear rate and provides improved film speed relative to Comp. 3 and higher contrast. It is also surprising that Inv. 4 works so well given that it has such a low absorbance at 365 nm.

G-Line Sensitivity

In another experiment, films of Photopolymer Compositions 10 (inventive) and 11 (comparative) were coated on Si wafers and exposed through a mask on a contact aligner type of exposure tool using just g-line radiation (436 nm). Compound (3-2) in Photopolymer Composition 10 has strong absorbance in g-line (and i-line) and was found to form good images at or above about 50 mJ/cm$^2$ exposure using HFE-7300 as the developing agent. The comparative Photopolymer Composition 11, not having an attached sensitizing dye, did not form an image under similar exposure doses.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photoresist layer on substrate step
4 form exposed photoresist layer step
6 form developed structure step
8 form treated structure step
10 remove first pattern of photoresist step
20 substrate
22 support
24 layer of active organic material
26 photoresist layer
28 light
30 photomask
32 exposed photoresist layer
34 exposed areas
36 non-exposed areas
38 developed structure
40 first pattern of photoresist
42 second pattern of uncovered substrate
44 treated structure
46 patterned layer of active organic material
48 patterned active organic material structure
120 substrate
126 photoresist layer
138 developed structure
140 first pattern of photoresist
142 second pattern of uncovered substrate
144 treated structure
145 layer of active organic material
146 patterned layer of active organic material
148 patterned active organic material structure

The invention claimed is:

1. A method of patterning a device comprising:
providing on a device substrate a layer of a fluorinated photopolymer comprising at least three distinct repeating units including a first repeating unit having a fluorine-containing group, a second repeating unit having an acid- or alcohol-forming precursor group, and a third repeating unit having a coumarin-based sensitizing dye, wherein the photopolymer is a copolymer formed from a first monomer having a fluorine-containing group, a second monomer having an acid- or alcohol-forming precursor group, and a third monomer having a structure according to formula (3):

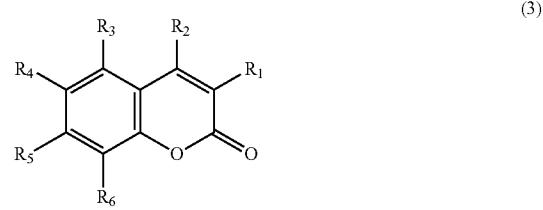

(3)

wherein at least one of substituents R$_1$ through R$_6$ is a polymerizable group and the remaining substituents independently represent a hydrogen atom, a halogen atom, a cyano group, or a substituted or unsubstituted alkyl, alkoxy, alkylthio, aryl, aryloxy, amino, alkanoate, benzoate, alkyl ester, aryl ester, alkanone, alkyl sulfone, aryl sulfone or monovalent heterocyclic group, and wherein the photopolymer has a total fluorine content in a range of 15 to 60% by weight;

exposing the photopolymer layer to patterned light to form an exposed photopolymer layer;

contacting the exposed photopolymer layer with a developing agent to remove a portion of the exposed photopolymer layer in accordance with the patterned light, thereby forming a developed structure having a first pattern of photopolymer covering the substrate and a complementary second pattern of uncovered substrate corresponding to the removed portion of photopolymer, the developing agent comprising at least 50% by volume of a fluorinated solvent.

2. The method of claim 1 wherein the fluorinated solvent is a hydrofluoroether.

3. The method of claim 1 wherein the photopolymer has a total fluorine content in a range of 30 to 60% by weight.

4. The method of claim 1 wherein the device substrate comprises a support and a layer of active organic material, and wherein the fluorinated photopolymer layer is in contact with the layer of active organic material.

5. The method of claim 1 further including:
treating the developed structure to form a treated structure; and
contacting the treated structure with a stripping agent to remove the first pattern of photopolymer.

6. The method of claim 5 wherein the substrate comprises a support and a layer of active organic material, and wherein the photopolymer layer is in contact with the layer of active organic material.

7. The method of claim 6 wherein the treating includes chemical or physical etching of the active organic material in the second pattern of uncovered substrate, thereby forming a patterned layer of active organic material corresponding to the first pattern.

8. The method of claim 5 wherein the treating includes providing a layer of active organic material over both the first pattern of photopolymer and the second pattern of uncovered substrate, wherein the removal of the first pattern of photopolymer further removes active organic material formed over the first pattern of photopolymer, thereby forming a patterned layer of active organic material corresponding to the second pattern.

9. The method of claim 1 wherein the total fluorine content of the copolymer is in a range of 35 to 55% by weight.

10. The method of claim 1 wherein the first monomer is provided in a range of 40 to 90% by weight relative to the copolymer.

11. The method of claim 1 wherein the first monomer is a fluoroalkyl acrylate.

12. The method of claim 1 wherein the third monomer has no fluorine atoms and further wherein the third monomer is provided in a range of 1 to 4% by weight relative to the copolymer.

13. The method of claim 1 wherein the third monomer has one or more fluorine atoms and further wherein the third monomer is provided in a range of 1 to 20% by weight relative to the copolymer.

14. The method of claim 1, wherein the third monomer is one of:

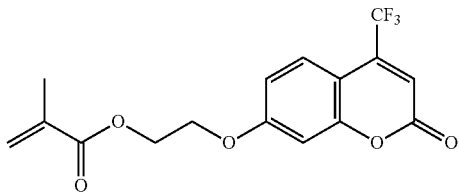

(3-4)

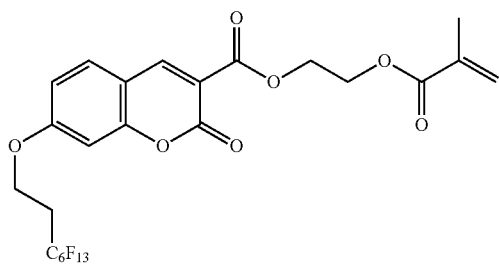

(3-5)

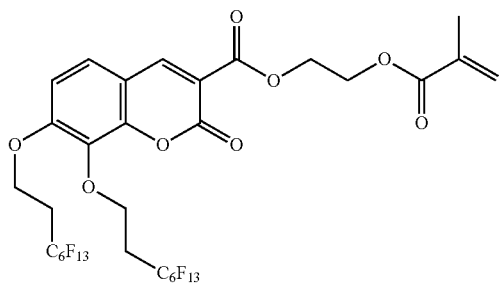

(3-6)

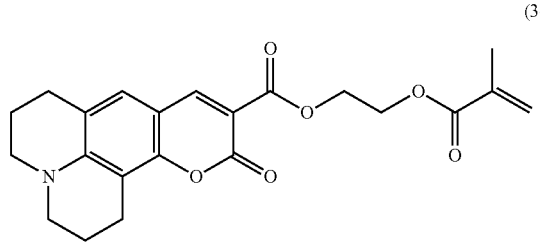

(3-1)

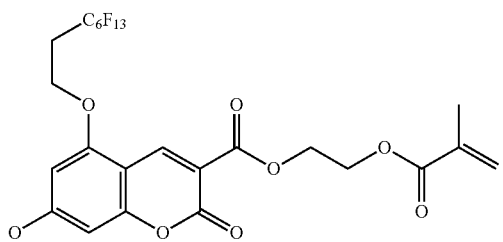

(3-7)

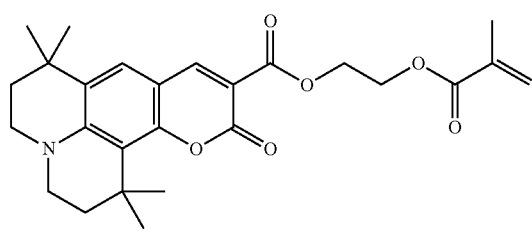

(3-2)

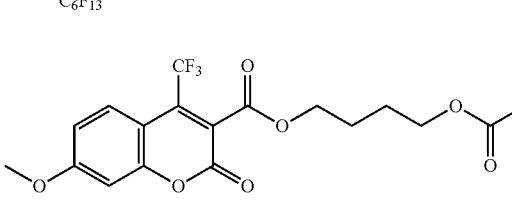

(3-8)

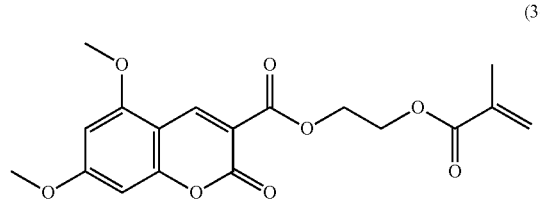

(3-3)

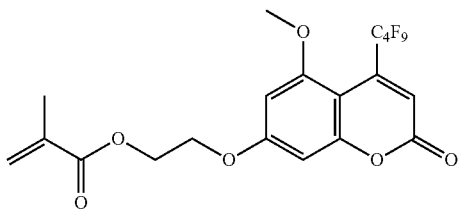

(3-9)

(3-10)
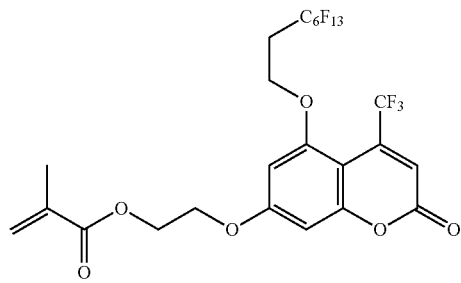
(3-11)
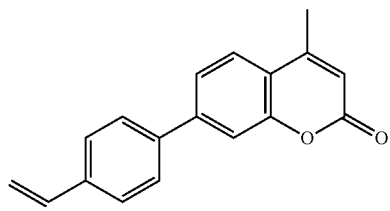
(3-12)
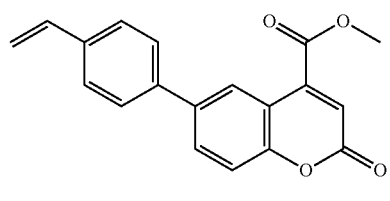
(3-13)
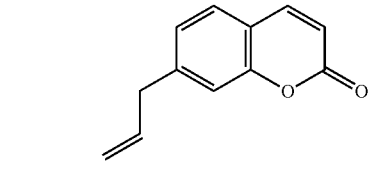
(3-14)
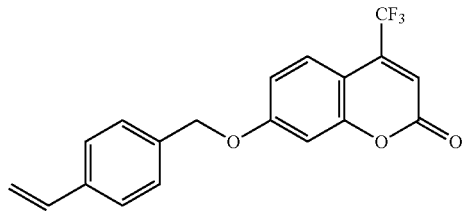
(3-15)
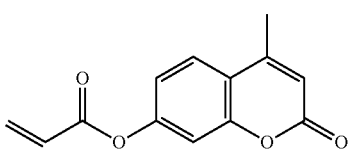
(3-16)
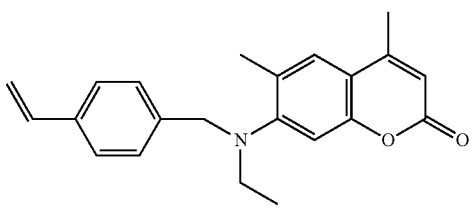
(3-17)
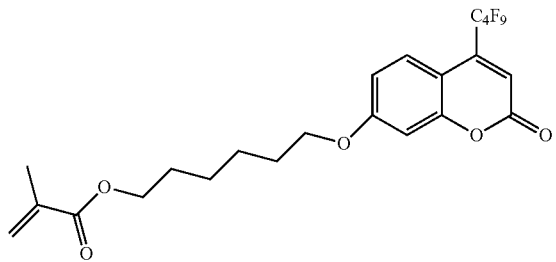
(3-18)
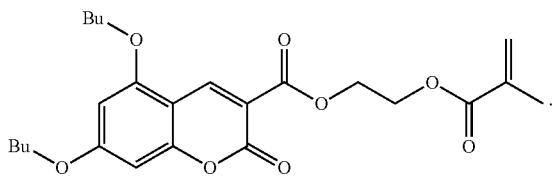
* * * * *